(12) United States Patent
Streit

(10) Patent No.: US 9,523,730 B2
(45) Date of Patent: Dec. 20, 2016

(54) ARCHITECTURE AND METHOD TO DETERMINE LEAKAGE IMPEDANCE AND LEAKAGE VOLTAGE NODE

(71) Applicant: Analog Devices, Inc., Norwood, MA (US)

(72) Inventor: Lawrence C. Streit, Noblesville, IN (US)

(73) Assignee: Analog Devices, Inc., Norwood, MA (US)

( * ) Notice: Subject to any disclaimer, the term of this patent is extended or adjusted under 35 U.S.C. 154(b) by 711 days.

(21) Appl. No.: 13/756,101

(22) Filed: Jan. 31, 2013

(65) Prior Publication Data

US 2013/0151175 A1    Jun. 13, 2013

Related U.S. Application Data

(63) Continuation-in-part of application No. 13/548,597, filed on Jul. 13, 2012, which is a continuation of
(Continued)

(51) Int. Cl.
*G01R 27/00* (2006.01)
*G01R 31/02* (2006.01)
(Continued)

(52) U.S. Cl.
CPC ........... *G01R 31/025* (2013.01); *G01R 31/362* (2013.01); *G06F 17/00* (2013.01); *G01R 19/2509* (2013.01)

(58) Field of Classification Search
CPC ...... G01R 31/025; G01R 31/362; G06F 17/00
See application file for complete search history.

(56) References Cited

U.S. PATENT DOCUMENTS

| 4,472,676 A | 9/1984 | Eichmann et al. |
| 4,808,914 A | 2/1989 | Talmor |

(Continued)

OTHER PUBLICATIONS

SAE International, Surface Vehicle Recommended Practice, J1766, Revised Apr. 2005.
(Continued)

*Primary Examiner* — Minh N Tang
(74) *Attorney, Agent, or Firm* — Patent Capital Group

(57) ABSTRACT

A circuit, system, machine-readable storage medium and method for detecting the leakage impedance in a voltage source is described. The method for identifying a presence of a leakage path in a multi-cell floating voltage source may include supplying a current to a node of the floating voltage source and sampling the voltage of the floating voltage source using a pair of amplifiers connecting in inverting configurations. The method may include sampling a reference ground potential using a reference amplifier connected in an inverting configuration. Each of the amplifiers may output an output signal. The method may include adjusting the current supplied to the node of the floating voltage source and resampling the voltage of the floating voltage source and the reference ground potential. The value of the leakage impedance may be calculated using the sampled and resampled values. The measurements may be performed independent of the battery voltage.

33 Claims, 8 Drawing Sheets

Related U.S. Application Data application No. 12/748,331, filed on Mar. 26, 2010, now Pat. No. 8,222,907, and application No. 13/756,101, Jan. 31, 2013.

(60) Provisional application No. 61/167,724, filed on Apr. 8, 2009, provisional application No. 61/601,818, filed on Feb. 22, 2012, provisional application No. 61/601,830, filed on Feb. 22, 2012.

(51) Int. Cl.
  *G06F 17/00* (2006.01)
  *G01R 31/36* (2006.01)
  *G01R 19/25* (2006.01)

(56) References Cited

U.S. PATENT DOCUMENTS

| | | |
|---|---|---|
| 4,990,845 A | 2/1991 | Gord |
| 5,481,194 A | 1/1996 | Schantz et al. |
| 6,639,464 B2 | 10/2003 | Hellberg |
| 6,700,384 B2 | 3/2004 | Yugou |
| 6,952,103 B2 | 10/2005 | Herb et al. |
| 7,012,693 B2 | 3/2006 | Mori et al. |
| 7,566,878 B2 | 7/2009 | Iwakiri |
| 7,970,125 B2 | 6/2011 | Apfel et al. |
| 7,994,799 B2 | 8/2011 | Tachizaki |
| 8,040,139 B2 | 10/2011 | Plagens et al. |
| 8,054,208 B2 | 11/2011 | Fletcher et al. |
| 8,779,784 B2 * | 7/2014 | Yang ............... G01R 27/16 324/426 |
| 2005/0206641 A1 | 9/2005 | Morita |
| 2007/0285057 A1 | 12/2007 | Yano |
| 2008/0054907 A1 | 3/2008 | Kudo et al. |
| 2008/0158756 A1 | 7/2008 | Lindsey et al. |
| 2010/0141268 A1 | 6/2010 | Hartzog et al. |
| 2010/0259281 A1 | 10/2010 | Streit |

OTHER PUBLICATIONS

UN Economic and Social Council, ECE/TRANS/WP.29/2010/52, pp. 1-45, Dec. 22, 2009.
International Search Report and Written Opinion of the International Searching Authority in counterpart International Application No. PCT/US2013/026900, report dated May 3, 2013.

* cited by examiner

100

200

300

500

600

700

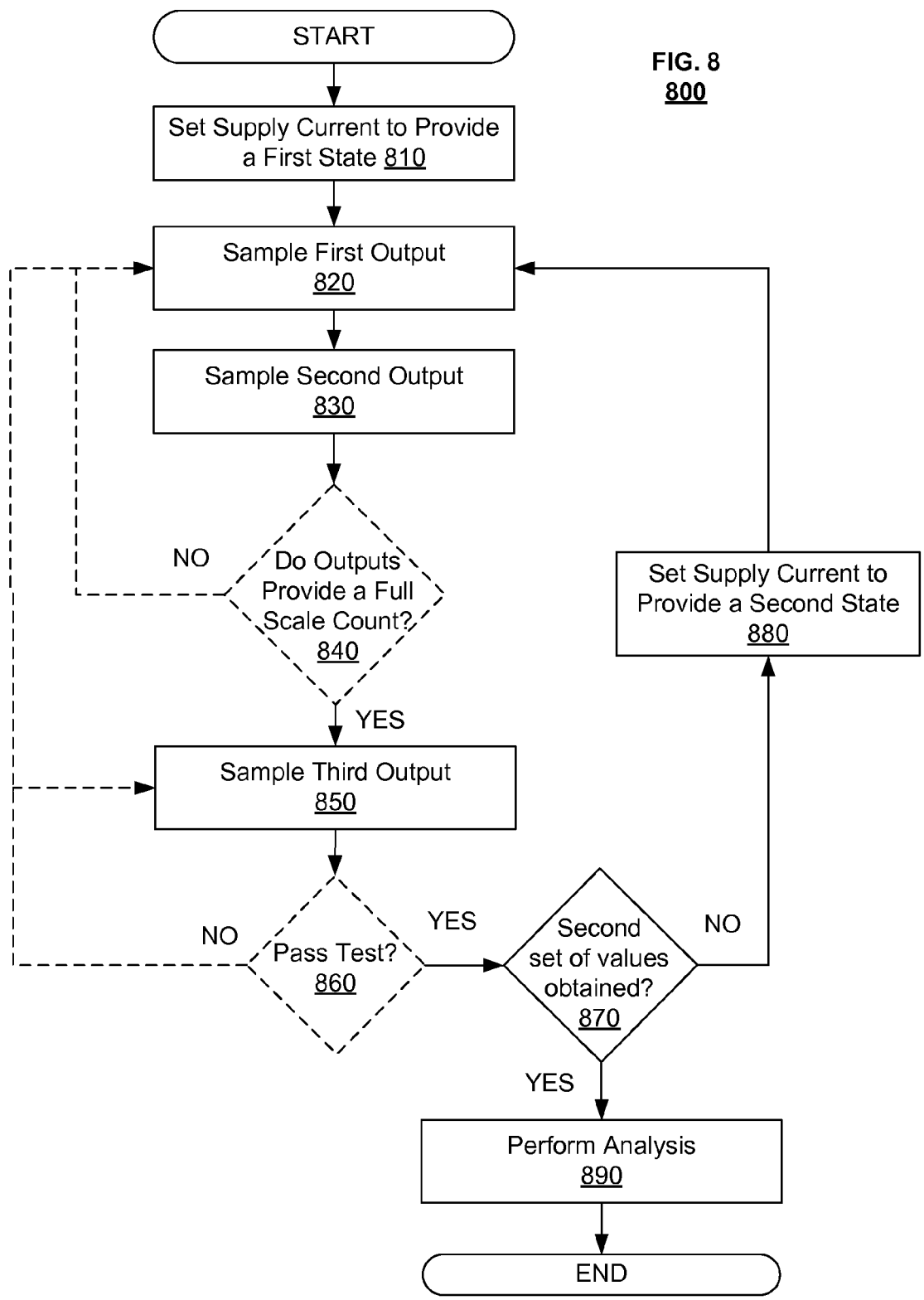

ARCHITECTURE AND METHOD TO DETERMINE LEAKAGE IMPEDANCE AND LEAKAGE VOLTAGE NODE

PRIORITY CLAIM

This application is a continuation-in-part of U.S. patent application Ser. No. 13/548,597, filed on Jul. 13, 2012, which is a continuation of U.S. patent application Ser. No. 12/748,331, filed on Mar. 26, 2010, now issued as U.S. Pat. No. 8,222,907, which claims the benefit of U.S. Provisional Patent Application Ser. No. 61/167,724, filed on Apr. 8, 2009, and which is related to commonly-assigned U.S. patent application Ser. No. 12/748,117, filed on Mar. 26, 2010, now issued as U.S. Pat. No. 8,427,167, each of which are incorporated herein by reference.

The present application claims priority to U.S. Provisional Application No. 61/601,818, filed on Feb. 22, 2012 and to U.S. Provisional Application No. 61/601,830, filed on Feb. 22, 2012, each of which are incorporated by reference herein.

BACKGROUND

The present invention is directed to a circuit and method for detecting the presence of leakage impedance and determining its location within a high voltage stack of direct current voltage sources (e.g., a battery). Leakage impedance is an error condition where a battery in a battery stack, such as in a hybrid vehicle or an isolated remote power source, is experiencing a fault condition, for example, caused by faulty circuit components and/or faulty insulation or the like. The leakage impedance indicates that a circuit path from the floating battery to chassis of the vehicle is formed. This can be a potentially life-threatening hazard. Previous attempts to make determinations of leakage impedance and location of leakage voltage nodes were costly and/or had measurement errors that were unacceptable. Accordingly, there is a need for a low cost and more precise alternative to the prior art systems.

BRIEF DESCRIPTION OF THE DRAWINGS

The accompanying drawings illustrate the present invention and, together with the description, further serve to explain the principles of the invention and to enable one skilled in the pertinent art to make and use the invention.

FIG. 8 illustrates an exemplary method for processing the measurements of a detection circuit according to another embodiment of the present invention.

DETAILED DESCRIPTION

Figure 1:
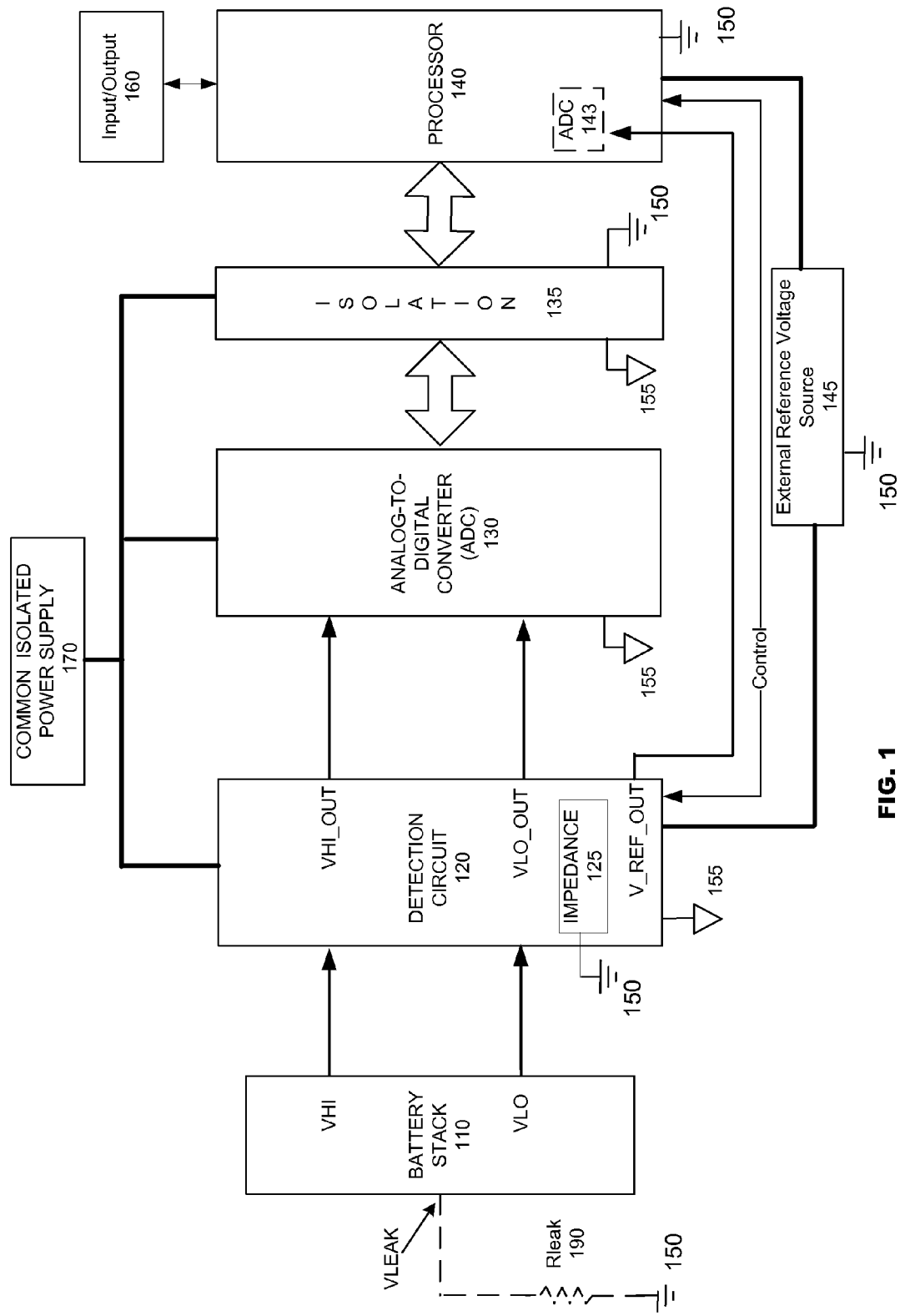
FIG. 1 illustrates a general implementation according to an embodiment of the present invention.

Embodiments of the present invention provide a machine-readable storage medium comprising program instructions executable by a processor and a method for identifying a presence of a leakage path in a multi-cell voltage source. The voltage of the floating voltage source may be sampled using a pair of amplifiers connecting in inverting configurations. Each of the pair of amplifiers may output an output signal. A reference voltage relative to a reference ground potential may be sampled. The sampled amplifier output signals and the sampled reference voltage may be stored in a memory. The voltage of the floating voltage source and the reference voltage may be resampled. Using the sampled and resampled values, values of a leakage impedance, and an offset voltage may be calculated. The calculated values of the leakage impedance and offset voltage may be compared with threshold values for each of the leakage impedance and offset voltage. Based on the result of the comparison, a notification may be generated indicating that a threshold value of any one of the leakage impedance and offset voltage has been exceeded.

Embodiments of the present invention provide a system for determining a leakage impedance, a leakage voltage and measuring voltage of a battery source. The system may include a voltage source, a detection circuit, and a processor. The voltage source may be formed from multiple voltage cells. The detection circuit may include a first amplifier and a second amplifier. A first input of the first amplifier may be connected to a first terminal of the voltage source and the first input of the second amplifier may be connected to a second terminal of the voltage source. A second input of each of the first and second amplifiers may be connected to an isolated ground. An output of each of the first and second amplifiers may be connected to a respective first and second output of the detection circuit. The processor may sample the outputs of each of the first and second amplifiers and the reference ground potential to identify at least one of a leakage impedance and an offset voltage and a voltage of the voltage source.

Embodiments of the present invention provide a circuit for detecting a leakage impedance and leakage voltage of a voltage source having a plurality of voltage sources. The circuit may include three inputs, three amplifiers, three outputs and inputs for an isolated power supply. A first input of the two inputs may be connected to a positive terminal of the voltage source and a second input of the two inputs may be connected to a negative terminal of the voltage source. The non-inverting input of each of the pair of amplifiers may be connected to a reference capacitor. The output of each of the amplifiers may be connected to a respective one of the two outputs of the circuit. A third amplifier may have a first input connected to a reference resistor and a second input may be connected to a reference voltage source. An output may be connected to a third output of the circuit. The reference capacitor may be connected to a reference ground potential. The inputs from the isolated power supply may be connected to power supply terminals of the first amplifier and the second amplifier to provide power to the first and second amplifiers. The power supplied by the isolated power supply may be with reference to an isolated ground potential that may be different than the reference ground potential.

The exemplary system 100 illustrated in FIG. 1 may include a battery stack 110, and a detection circuit 120, an analog-to-digital (ADC) converter 130, an isolation device 135, a processor 140, an external voltage supply 145, a isolated power supply 170 and inputs/outputs 160 according to an embodiment of the present invention. The battery stack 110 may be comprised of a number of stacked cells that may form a voltage source used in, for example, a hybrid electric vehicle or an electric vehicle. The battery stack 110 may be a DC voltage source, and may have a positive terminal (labeled VHI) and a negative terminal (labeled VLO). The battery stack 110 may not be connected electrically to the chassis 150 of the vehicle. The battery stack 110 may be called a "floating" voltage source when not connected to the chassis 150. In such a case, the chassis 150 may be considered a reference ground potential. A fault condition may occur in the battery stack 110 due to a faulty circuit component, faulty insulation and the like, which may result in the presence of a leakage path, shown in phantom, between the battery stack 110 and the chassis 150. The leakage path may have a leakage impedance Rleak 190, and when leakage current is present, a leakage voltage VLEAK may be present across leakage impedance Rleak 190.

The detection circuit 120 may be connected to the battery stack 110 to condition the voltages VHI and VLO. The detection circuit 120 may comprise an impedance 125 (which will be explained in more detail below) that may be electrically connected to the chassis 150. In addition, the detection circuit 120 may also have a connection to an isolated ground 155. The detection circuit 120 may be configured to condition voltages VHI, VLO and V_REF and output signals VHI_OUT, VLO_OUT and V_REF_OUT that are, respectively, representative of the measured voltages. The detection circuit 120 may be implemented as a stand-alone circuit component, or incorporated in an application specific standard product (ASSP).

The signals VHI_OUT and VLO_OUT may be output from the detection circuit 120 to an analog-to-digital converter (ADC) 130, and the signal V_REF_OUT may be directly sampled by processor 140 via an analog-to-digital converter circuit 143. The ADC 130 may convert received output signals from an analog signal to a digital signal, and output through isolation 135 to a processor 140 for processing. The processor 140 may store the values of the signals over time, and use the supplied signals to determine whether a leakage impedance Rleak 190 is present, and the related value of a leakage voltage and the leakage impedance Rleak 190. Although the ADC 130 is shown in the illustrated example located prior to the isolation, one of skill in the art may reconfigure the exemplary arrangement by placing the ADC 130 in the location of the processor 140 or placing the processor 140 in the location of the ADC 130. The isolation 135 can remain between the processor 140 and the ADC 130.

The processor/controller 140 may include a processor and a memory, or have access to a memory, for storing data measured by the processor 140 such as voltage signals output by the ADC 130 or voltage signals output via an ADC 143 directly from the detection circuit 120. In addition, the memory (e.g., of the processor 140) may store pre-programmed data and computer program instructions. The memory may also be accessed for reading and writing functions via input/outputs 160. The processor/controller 140 may be a processor or controller, already available that performs other system processing and/or control, or processor 140 may forward the digital signals to another processor for processing. Alternatively, the processor/controller 140 may be implemented as an FPGA, gate array or any other known method of providing the processing functions. The processor/controller 140 may control the operation of the external voltage source 145. Optionally, the processor 140 may connect to input/output devices 160 to present battery stack 110 status, alarm conditions or other information, in an audible, tactile and/or a visual presentation, to an output device, such as a monitor or speaker. An alarm condition may be, for example, when the magnitude of the derived leakage impedance and/or derived leakage voltage exceeds a predetermined threshold or presents a hazard. An input device may be a touch screen, a button, a keypad, or the like.

The isolation device 135 provides electrical isolation of the processor/controller 140 from the battery stack 110, the detection circuit 120 and/or the ADC 130. The isolation device 135 may have connections to both the chassis 150 and isolated ground 155. The chassis 150 is electrically isolated from the isolated ground 155.

Various voltage sources may provide either signal voltages or supply power to the system 100. For example, an isolated power supply 170 may provide power to the detection circuit 120, the ADC 130, and the isolation device 135. The isolated power supply 170 may be connected to isolated ground 155. Another voltage source may be an external reference voltage source 145 that may be external to, or part of, the processor/controller 140. The external reference voltage source 145 may be under control of the processor/controller 140, and may output a signal with reference to chassis 150 in the form of a sinusoid, ramp signal, a step signal or other form of voltage signal pattern to the detection circuit 120. The operation of the system 100 will be described in more detail with reference to FIGS. 3 and 4. The above illustrated system configuration is only an example, and the system may be implemented in other configurations as known by those of skill in the art.

Figure 2:
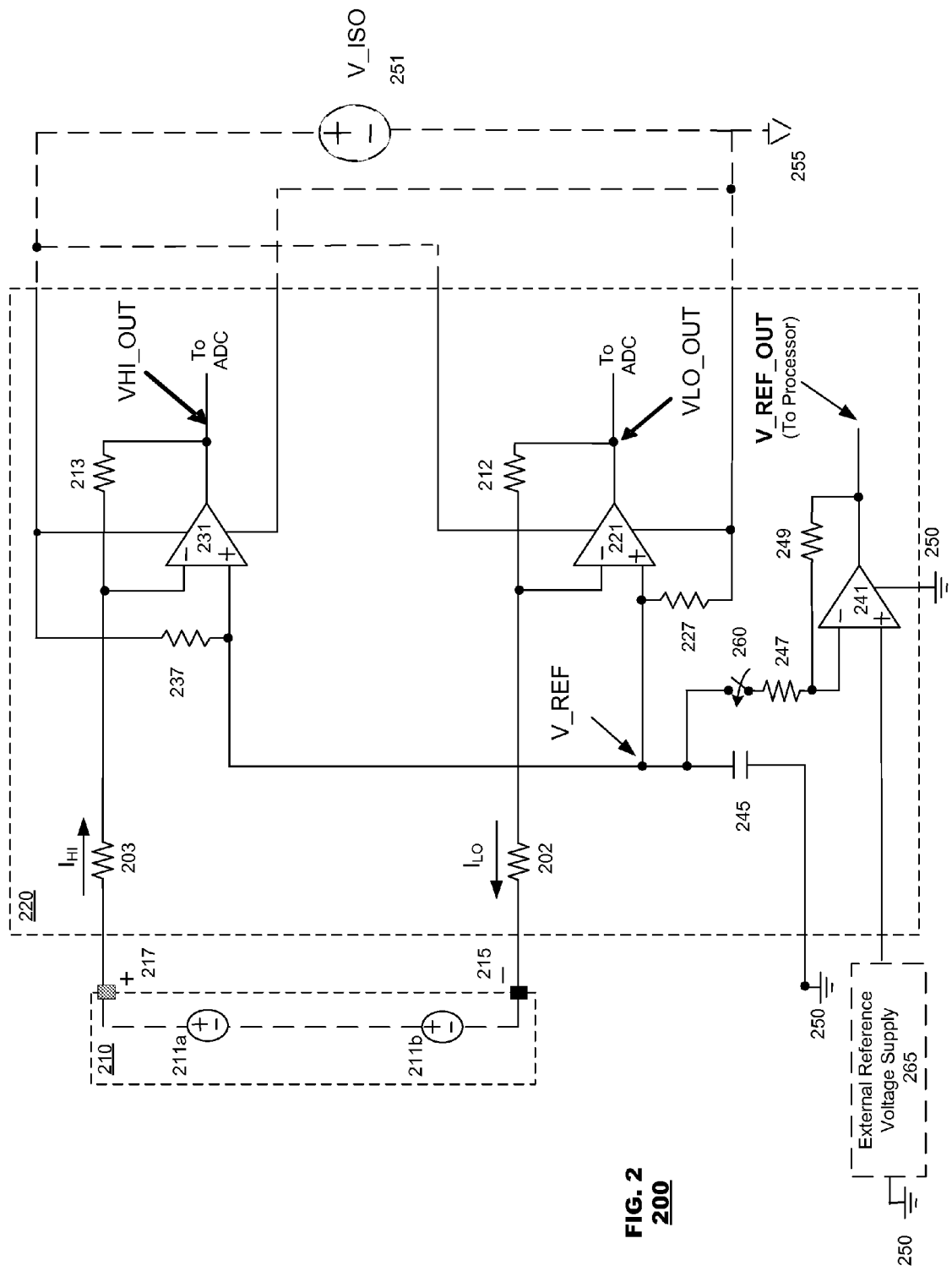
FIG. 2 illustrates an exemplary circuit according to an embodiment of the present invention.

A more detailed description of an exemplary configuration of the detection circuit in combination with a battery stack will be made with reference to FIG. 2. The detection circuit 220 in FIG. 2 is shown connected to a battery stack 210. In the example of FIG. 2, the battery stack 210, shown in phantom, is illustrated in an exemplary operating condition in which a leakage impedance is not present.

As explained above, the battery stack 210 may comprise a plurality of battery cells. For ease of explanation, the battery stack 210 is modeled as a pair of voltage sources 211a and 211b with the positive (+) terminal connected to node 217 and the negative terminal (−) connected to node 215. The battery stack 210 may have a total battery voltage that is equal to the sum of voltages provided by voltage sources 211a and 211b, respectively.

The detection circuit 220 may include several inputs, several outputs, amplifiers 221, 231, and 241, a pair of input resistors 202, 203, feedback resistors 212, 213, and 249, a pair of bias resistors 227, 237, a reference capacitor 245, a reference resistor 247, and a switch 260. Each of the amplifiers 221, 231 have inputs, power supply connections and an output as is known in the art. The amplifiers 221, 231 may each have a non-inverting input terminal connected to the reference capacitor 245, and, respectively, to one terminal of each of the bias resistors 227 and 237. Each of the amplifiers 221 and 231 may be connecting in an inverting configuration with a feedback resistor 212, 213 connected to their respective inverting inputs. Bias resistors 227 and 237 may be sized to bias the non-inverting inputs of the amplifiers 221, 231 to a potential relative to the isolated ground 255. Other components or devices may be substituted for bias resistors 227 and 237 to provide the same function. Further, the switch 260 and resistor 247 may be replaced by a variable resistor or a bank of switchable resistors.

A first input of the detection circuit 220 may connect to the positive (+) terminal 217 of battery stack 210, and a second input may connect to the negative (−) terminal 215 of the battery stack 210. A third input of the detection circuit 220 may connect to the chassis 250 of the vehicle in which the battery stack 210 may be located. The first input of the detection circuit 220 may be connected to a first terminal of the input resistor 203. The second input of the detection circuit 220 may be connected to a first terminal of the input resistor 202. The third input may be connected to a first terminal of reference capacitor 245, and be connected to the negative supply node of the amplifier 241.

A second terminal of the input resistor 203 may connect to the inverting input of the amplifier 231. Similarly, a second terminal of resistor 202 may connect to the inverting input of the amplifier 221. Since the amplifiers 221 and 231 may be configured in an inverting configuration, the feedback resistors 212 and 213 may be connected to both the inverting input and the output of the respective amplifiers 221 and 231. The input resistors 202 and 203 may be of equal resistance value, and may have a resistance value of approximately 300K to 2M ohms depending upon the resistance value of the reference resistor 247, but is not so limited. The feedback resistors 212 and 213 may have resistance values orders of magnitude smaller than the resistance values of input resistors 202 and 203. The feedback resistors 212 and 213 may have the same resistance values.

In summary, the inverting input of the amplifier 221 may be connected to resistor 202 and feedback resistor 212, the non-inverting input of the amplifier 221 may be connected to chassis 250 via reference capacitor 245, and the output of the amplifier 221 may be connected to the second terminal of feedback resistor 212. The amplifier 221 may output an analog signal VLO_OUT to an analog-to-digital converter (ADC) (not shown) for conversion to a digital signal.

Similarly, the amplifier 231 may have an inverting input connected to input resistor 203 and feedback resistor 213, the non-inverting input may be connected to chassis 250 via reference capacitor 245, and the output of the amplifier may be connected to a second terminal of feedback resistor 213. The amplifier 231 may output an analog signal VHI_OUT to an analog-to-digital converter (ADC) (not shown) for conversion to a digital signal.

A first terminal of reference capacitor 245 may be connected to the third input of the detection circuit 220, which may be connected to chassis 250. The second terminal of the reference capacitor 245 may be connected to the non-inverting input of amplifier 221 and to the non-inverting input of amplifier 231. The capacitance value of reference capacitor 245 may have an approximate capacitance value similar to high voltage capacitors used in hybrid vehicle systems.

Also connected to the second terminal of the reference capacitor 245 may be a switch 260. The switch 260 may be controlled by a processor/controller (not shown). The switch 260 may be a transistor, MOSFET, relay, photo-MOS or other switch as is known in the art. The switch 260 may be actuated by a signal from the processor/controller (not shown). The switch 260 when closed, may complete a circuit path connecting a first terminal of a reference resistor 247, and the reference amplifier 241, which is configured in an inverting configuration, to the second terminal of the reference capacitor 245 and the non-inverting inputs of amplifiers 221 and 231.

Opening and closing the switch 260 can change the operational state of the circuit 200. By changing the operational state of the circuit 200, determination of the presence and/or value of a leakage impedance can be made possible, as more fully described below. As mentioned earlier, a variable resistor or a bank of switchable resistors can be used in place of the switch 260 and resistor 247. Varying the value of this adjustable resistance, the operational state of the circuit 200 can also be varied so that, in turn, the presence and/or value of a leakage impedance can be determined. In general, any variation of the operational state of the circuit 200 can be used to determine the presence and/or value of a leakage impedance. For example, the state of the circuit 200 can be changed by changing the resistance values of the input resistor 202, the input resistor 203, and the reference resistor 247, or the external reference voltage supply 265, either alone or in any combination thereof. In another embodiment, a resistor can be provided in parallel with the capacitor 245 to change the operational state of the circuit 200.

A second terminal of the reference resistor 247 and a first terminal of the feedback resistor 249 may be connected to an inverting input of the reference amplifier 241. An external reference voltage supply 265 that may be controlled by a processor/controller (not shown) may be connected to the non-inverting input of the reference amplifier 241. An output of reference amplifier 241 may be connected to the second terminal of feedback resistor 249 and to an output of the detection circuit 220. The output of reference amplifier 241, output signal V_REF_OUT, may also be provided to the processor/controller (not shown). The reference amplifier 241 has a power supply with reference to chassis 250 potential.

The detection circuit 220 may also be connected to, or include, an isolated power supply 251. The isolated power supply 251 may supply both negative and positive power to the amplifiers 221 and 231, and be connected to an isolated ground 255. The positive (+) terminal of the isolated power supply 251 may connect to the positive power supply terminal of both amplifiers 221, 231 and to a first terminal of a bias resistor 237. A second terminal of the bias resistor 237 may connect to the non-inverting terminal of amplifiers 231 and 221, and to reference capacitor 245 and switch 260. The negative (−) terminal of the isolated power supply 251 may connect to the negative power supply terminals of both amplifiers 221 and 231, and a first terminal of a bias resistor 227. The second terminal of bias resistor 227 may connect to the non-inverting input of amplifiers 231 and 221.

With reference to FIG. 2, the currents $I_{HI}$ and $I_{LO}$ may be substantially equal. Since input resistors 202 and 203 may be matched, the voltage drop across input resistor 202 is equal to, but of opposite polarity to, the voltage drop across input resistor 203. This leaves an equal voltage potential, but of opposite polarity, on the respective nodes 215 and 217 relative to chassis 250. The battery stack 210 voltage may be substantially equal to the sum of the voltage drops across the input resistors 202 and 203.

In the illustrated example, amplifier 221 may output a voltage VLO_OUT, which may have a positive voltage potential relative to V_REF proportional to the difference between the voltage V_REF at the second terminal of reference capacitor 245 and the voltage potential at (negative terminal) node 215. Effectively, the voltage signal VLO_OUT relative to V_REF may be equal to the product of current $I_{LO}$ and the resistance value of feedback resistor 212.

Amplifier 231 may output a voltage VHI_OUT, which may have a negative potential relative to V_REF and may be proportional to the difference between the voltage V_REF at the second terminal of reference capacitor 245 and the voltage potential at (positive terminal) node 217. Effectively, the voltage signals VHI_OUT relative to V_REF may be equal to the product of the current $I_{HI}$ and the resistance value of feedback resistor 213. The voltage signals VLO_OUT and VHI_OUT may remain substantially constant, and may be output to an ADC (not shown). The ADC may convert the signals to a digital signal, which may be sampled by a processor. The sampling may occur at predetermined intervals, which may change based on changes in the sampled values.

Each of the voltages VLO_OUT and VHI_OUT may be output to either an analog-to-digital converter (ADC) (not shown) for conversion to a digital value that may be output to a processor/controller (not shown) for processing, and the voltage V_REF_OUT may be output directly to the processor/controller. These values VLO_OUT, VHI_OUT, and V_REF_OUT may be used to determine whether a leakage impedance and/or leakage voltage is present, and to determine the battery stack 210 voltage (e.g., the sum of voltage sources 211a plus 211b). The values VLO_OUT, VHI_OUT, and V_REF_OUT can be determined for two different operational states of the circuit 200, enabling the presence and/or value of the leakage impendence to be determined. That is, during a first operational state of the circuit 200, the values VLO_OUT, VHI_OUT, and V_REF_OUT can be sampled and provided to a processor for processing—and during a second operational state of the circuit 200, the values VLO_OUT, VHI_OUT, and V_REF_OUT can again be sampled and provided to a processor for processing. These different sampled values under each operational state can be used by the processor to determine the presence and/or value of a leakage impedance. The different operational states of the circuit 200 can be introduced based on the methods described above (e.g., by opening/closing switch 260; varying a resistance value used in place of 260; including a resistor in parallel with the capacitor 245, etc.).

The exemplary configuration of the detection circuit 220 may or may not incorporate the isolated power supply 251 or a analog-to-digital converter (not shown) when the detection circuit is implemented as a stand-alone circuit component, or incorporated in an application specific standard product (ASSP) with an analog-to-digital converter.

Figure 3:
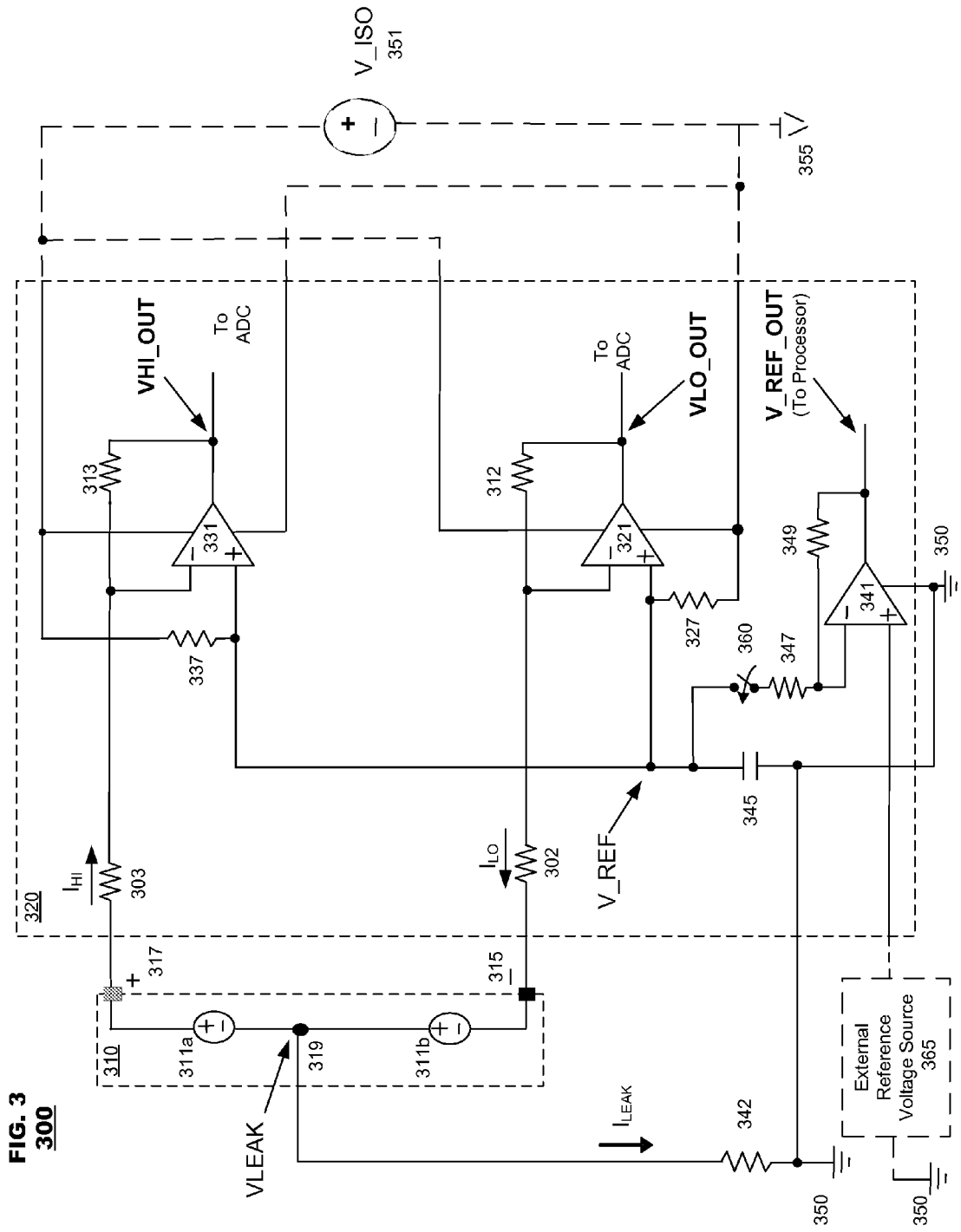
FIG. 3 illustrates the exemplary circuit of FIG. 2 and an implementation according to an embodiment of the present invention.

The detection of a leakage impedance and leakage voltage in the battery stack 210 will be described in more detail with reference to FIG. 3. The topology of the detection circuit 320 is substantially the same as detection circuit 220 described above with respect to FIG. 2, so further description will not be provided with respect to its configuration. FIG. 3 illustrates a battery stack 310 with a leakage impedance path modeled by leakage resistance 342 from an arbitrary leakage voltage (VLEAK) node 319 in battery stack 310 to chassis (reference ground potential) 350. Node 319 can occur anywhere within the battery stack 310, and is shown at an arbitrary location. The leakage impedance path is represented by a leakage resistance 342, and when a leakage current $I_{LEAK}$ is present from leakage voltage node 319 to chassis 350, a leakage voltage VLEAK at node 319 may be present. Leakage impedance 342, leakage voltage VLEAK and leakage current $I_{LEAK}$ can have various values that may or may not change over time.

The battery stack 310 is modeled with two voltage sources 311a and 311b. In certain circumstances, a leakage path may develop that is at an electrical mid-point of the battery stack 310, or the leakage path may be symmetrical. In other words, the voltage between the leakage voltage VLEAK node 319 and node 317 may be equal to the voltage of voltage source 311a, or half of the battery stack 310 voltage, and the voltage between node 319 and node 315 may be equal to the voltage of voltage source 311b, or the other half of the battery stack 310. In this case, the processor (not shown) may not have enough information to determine that a symmetrical leakage path is present.

Reviewing FIG. 3 under the assumption that leakage current $I_{LEAK}$ passes through leakage impedance Rleak 342 and chassis 350, the leakage current $I_{LEAK}$ may be input to the detection circuit 320 via the detection circuit connection to chassis 350. When leakage current $I_{LEAK}$ through leakage impedance 342 is initially present, the current $I_{LEAK} \approx I_{LO} - I_{HI}$. Also, the switch 360 is open, and the voltage V_REF_OUT is equal to the voltage provided by external voltage source 365.

Recall that the voltage V_REF in the absence of a leakage condition may maintain a voltage that is substantially equal to chassis 350 potential, or substantially zero (0) volts. When a leakage condition occurs and becomes evident due to leakage voltage node 319 in the battery stack, an offset voltage between the battery stack 310 voltage and the chassis 350 potential is present. Due to the location of node 319 (which is VLEAK) and the value of VLEAK, the voltage sources 311a or 311b may be unbalanced. For example, battery stack 310 may have a voltage of 100 volts without a leakage condition, where voltage source 311a provides 50 volts and voltage source 311b provides 50 volts, or in other words, the voltages sources 311a and 311b are symmetrical. However, with an asymmetrical leakage condition present, if the voltage of voltage 311a plus the voltage of 311b is equal to 100 volts, the individual voltage source 311a may be 25 volts, while individual voltage source 311b may be 75 volts. Each voltage source 311a and 311b may have a voltage that is offset by 25 volts from its normal 50 volts. This offset of voltage relative to symmetry may be referred to as the offset voltage. Returning to the operation of the detection circuit 320 under the assumption that a leakage path is present and leakage current ILEAK is flowing. The switch 360 may initially be open. To begin the detection of a leakage path, the processor may output a control signal causing the switch 360 to close. When a leakage current $I_{LEAK}$ flows through resistor 342 due to an imbalance of currents $I_{LO}$ and $I_{HI}$ the reference capacitor 345 begins to charge due to the current $I_{LEAK}$. As the reference capacitor 345 charges, a portion of the current $I_{LEAK}$ passes through reference resistor 347 and reference feedback resistor 349. The current through the resistors 347 and 349 causes a voltage to be present at the output of amplifier 341. After a predetermined time, when the capacitor 345 is fully charged, all of $I_{LEAK}$ flows through resistors 347 and 349, and the output of amplifier 341 is sampled by the processor (not shown). The processor may sample the output of amplifier 341 via an ADC, such as ADC 143 shown in FIG. 1. The representative reference voltage V_REF_OUT may be generated by a difference between an external reference voltage provided by external voltage source 365 and the voltage over reference feedback resistor 349, or a value of $I_{LEAK}$ times the resistance value of feedback resistor 349. In the presence of leakage current $I_{LEAK}$, the voltage V_REF_OUT may be different from the external reference voltage applied to the non-inverting input of the amplifier 341. Upon determining that V_REF_OUT does not correspond to the applied external reference voltage, the processor may generate a control signal to open the switch 360. Alternatively, if V_REF_OUT corresponds to the applied external reference voltage, the processor may change the applied external reference voltage to a different value, and, after a predetermined time, V_REF_OUT may be resampled. This is to confirm that a symmetrical leakage is not present. A determination subsequently may again be made whether the V_REF_OUT corresponds to the applied external reference voltage.

Under the assumption that V_REF_OUT does not correspond to the applied external reference voltage and with the switch 360 open, the leakage current $I_{LEAK}$ through leakage impedance 342 is substantially equal to $I_{HI}$ minus $I_{LO}$, or, as mentioned above, the current $I_{LEAK} \approx I_{LO} - I_{HI}$. After a time, the reference capacitor 345 may charge to a voltage V_REF that is equal to the offset voltage, and the leakage current $I_{LEAK}$ no longer flows, because the currents $I_{HI}$ and $I_{LO}$ return to being substantially equal. After waiting a predetermined time period, the processor may generate another control signal to close the switch 360. At that time the outputs VHI_OUT, VLO_OUT, and V_REF_OUT may be sampled, and the values may be stored in memory. The outputs VHI_OUT and VLO_OUT may be sampled via an ADC, such as ADC 130 shown in FIG. 1. From the values of outputs VHI_OUT and VLO_OUT, the voltage at the battery stack 310 nodes 317 and 315 may be determined, and from the output V_REF_OUT, the offset voltage may be determined. The processor may continue to sample V_REF_OUT to determine when it no longer changes, which occurs when the current $I_{LEAK}$ is approximately equal to the current $I_{LO}$ minus the current $I_{HI}$. Once V_REF_OUT reaches this steady state, the processor samples the outputs VLO_OUT, VHI_OUT and V_REF_OUT, and stores the sampled values in memory. The value of V_REF_OUT will be dependent upon the current $I_{LEAK}$ through reference resistor 347 and reference feedback resistor 349. This latest sample of voltage V_REF_OUT may be used to calculate Rleak since the resistance values of reference resistor 347, and input resistors 302 and 303 may be stored in memory. The latest samples of VHI_OUT and VLO_OUT provide the latest values of the battery node (317 and 315, respectively) voltages. Using the stored samples the voltages of the battery stack 310, the offset voltage and the leakage resistance RLEAK may all be calculated.

As discussed above with reference of FIG. 2, opening and closing the switch 360 can change the operational state of the circuit 300. By changing the operational state of the circuit 300, determination of the presence of a leakage impedance can be made possible. As mentioned earlier, a variable resistor or a bank of switchable resistors can be used in place of the switch 360 and resistor 347. Varying the value of this adjustable resistance, the operational state of the circuit 300 can also be varied so that, in turn, the presence of a leakage impedance can be determined. The state of the circuit 300 can also be changed by changing the resistance values of the input resistor 302, the input resistor 303, and the reference resistor 347, or the external reference voltage supply 365, either alone or in any combination thereof. In addition, a resistor may be provided in parallel with the capacitor 345 to change the operational state of the circuit 300.

An analog-to-digital converter (ADC) (not shown) may be connected to the detection circuit 320 to measure the output signals VHI_OUT, VLO_OUT and V_REF_OUT, digitize the measured values, and output the digitized values to a processor (not shown). The output signals VHI_OUT, VLO_OUT and V_REF_OUT may be sampled continuously, at predetermined intervals, or on a random basis, and the sampled measurements may be stored in memory. The stored measurements may be processed by the processor using, for example, the equations below to determine whether a value of offset voltage relative to symmetrical leakage, RLEAK and the approximate location of the leakage path in the battery stack 310.

The values VLO_OUT, VHI_OUT, and V_REF_OUT can be determined for two different operational states of the circuit 300. The values VLO_OUT, VHI_OUT, and V_REF_OUT may be sampled during the first operational state of the circuit 300 and again sampled during the second operational state of the circuit 300. These sampled values under each operational state can be used by the processor to determine the presence and/or value of a leakage impedance. The different operational states of the circuit 300 can be introduced based on the methods described above (e.g., by opening/closing switch 360; varying a resistance value used in place of 360; including a resistor in parallel with the capacitor 345, etc.).

Using the sampled measurements, the processor may perform arithmetic operations according to well known principles (such as methods for solving systems of equations containing multiple variables) that use the measurements to determine the presence and/or value of a leakage impedance RLEAK, and the values of the offset voltage. For example, the model for the battery leakage in FIG. 3 provides two unknowns (e.g., offset voltage and the leakage resistance) that can be determined by using the measurements taken during the at least two different operational states of the circuit 300. The processor, such as that shown in FIG. 1, may analyze the results of the arithmetic operations by comparing the results to stored threshold values. Based on the results of the comparison, the processor may provide an output indicating the presence of a leakage condition of the battery stack 310, or output the determined values of the leakage impedance RLEAK and the offset voltage to an output device. An exemplary method for processing the measurements will be described with reference to the flowchart illustrated in FIG. 4.

After a predetermined time, the output of amplifier 341 is sampled by the processor. In the absence of leakage current $I_{LEAK}$ the voltage V_REF_OUT may substantially correspond to the external reference voltage applied to the non-inverting input of the amplifier 341.

Figure 4:
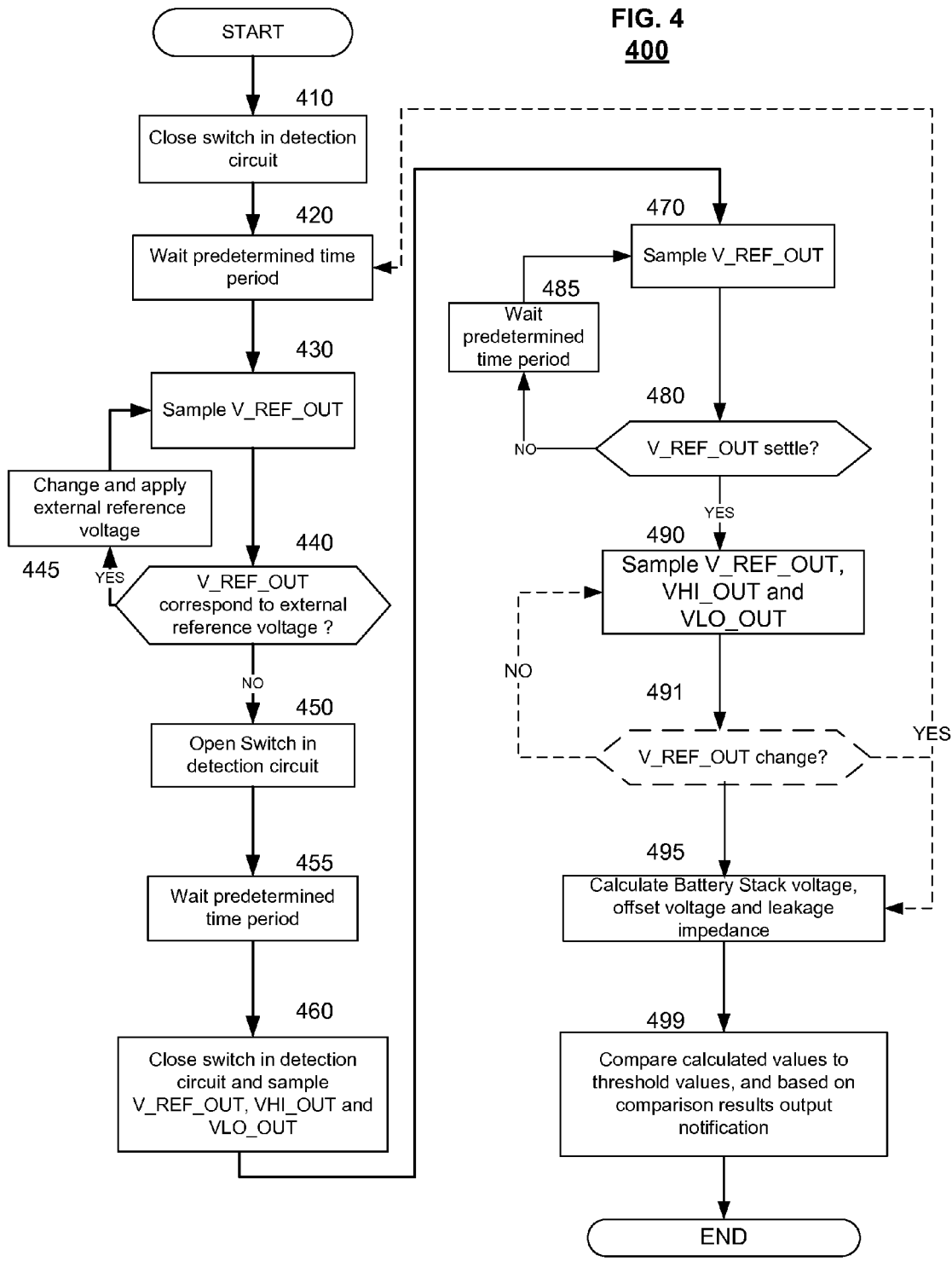
FIG. 4 illustrates an exemplary method according to an embodiment of the present invention.

FIG. 4 illustrates an exemplary method according to an embodiment of the present invention, and will be described with reference to FIG. 3. At step 410 of the exemplary process 400, a processor may generate a control signal to close a switch, such as switch 360, in the detection circuit. The closed switch may connect a reference amplifier and a reference resistor into the detection circuit. After waiting a predetermined time period at 420, the output V_REF_OUT may be sampled at 430. The output V_REF_OUT will indicate if there is a difference between an applied external reference voltage and a reference voltage node within the detection circuit. A determination may be made by a processor, such as processor 140, whether the sampled V_REF_OUT substantially corresponds to the applied external reference voltage. If the determination is "YES", this may indicate that either no leakage is present or that a symmetrical leakage is present. At step 445, the processor signals a change of the external reference voltage, and steps 420-440 are repeated. If the determination at 440 is "NO", the output V_REF_OUT does not substantially correspond to the applied external reference voltage, the process 400 proceeds to step 450 because this is a determination that a leakage path is present due to the presence of a leakage current.

At step 450, the processor generates a signal to open the switch 360 in the detection circuit. After a predetermined time period expires at 455, the switch 360, at 460, is closed based on a signal from the processor, and almost simultaneously the outputs VLO_OUT, VHI_OUT and V_REF_OUT may be sampled, and the values stored in memory. The process 400 proceeds to 470 at which the reference voltage V_REF_OUT may be sampled. At 480, it may be determined whether V_REF_OUT has settled to a steady value, if not the process 400 waits a predetermined amount of time at 485, and steps 470 and 480 are repeated. When V_REF_OUT is determined to have settled, the process proceeds to step 490. At step 490, the outputs VLO_OUT, VHI_OUT and V_REF_OUT may be sampled, and the values stored in memory. At step 495, the stored sample values may be used to calculate the battery stack 310 voltage, the offset voltage, and the leakage impedance 342.

In an alternative embodiment, step 491 shown in phantom may occur after step 490. Step 491 may perform a check to determine if the value V_REF_OUT changes from its previous sample value. If the answer is YES, it may return to step 420 to repeat the process. Alternatively, if after a predetermined number of iterations or predetermined time period, if a change of V_REF_OUT is not detected, process proceeds to step 495. The values calculated at 495 may be compared at 499, to threshold values that may be stored in memory. Based on the results of the comparison, a notification may be sent to an output device.

Since the resistance values of feedback resistors 312, 313 and 349 are known, a configuration cross check of the detection circuit may be performed using the sampled values VHI_OUT, VLO_OUT and V_REF_OUT to calculate the currents $I_{HI}$, $I_{LO}$ and $I_{LEAK}$/respectively. The difference of the calculated currents $I_{HI}$ to $I_{LO}$, if the circuit is operating properly, may be substantially equal $I_{LEAK}$. Of course, other methods of cross-checking the circuit configuration may be possible.

The method described with respect to FIG. 4 may be programmed and stored as computer instructions in firmware, a state machine, a memory device, or other machine-readable storage medium for execution by the above-described processor, or other device.

Exemplary Equations

Using standard nodal analysis, the following equations may be derived:

Equation 1—Solve for Voff:

$$VOFF = (-)V\_REF \qquad \text{Eq. 1}$$

Equation 2—if Resistor 302 Equals Resistor 303, the Leakage Resistance 342 May be Determined by:

$$R342 := -0.5 \cdot \frac{(-2 \cdot R347 \cdot Voff - 2 \cdot R347 \cdot V\_REF - 1 \cdot V\_REF \cdot R + V365 \cdot R)}{(-1 \cdot V\_REF + V365)} \qquad \text{Eq. 2}$$

Notes:
  Switch 360 is open (Eq. 1);
  Switch 360 is closed (Eq. 2);
  Vbatt=311b+311a, and is proportional to VLO_OUT−VHI_OUT (Eq. 1 and Eq. 2);
  Voff=Battery offset voltage from symmetry (for example: 311a=25 volts and 311b=75 volts, then Voff=25 volts) (Eq. 1);
  Input resistor 302 resistance value equals resistance value of input resistor 303 (Eq. 1 and Eq. 2);
  R342 equals the resistance value of the leakage resistance 342 (Eq. 2);
  R347 equals the resistance value of the reference resistor 347 (Eq. 2);
  V365 equals the voltage value of the external reference voltage supply 365 (Eq. 2);
  R equals the resistance value of input resistor 302 and the resistance value of the input resistor 303;
  Voff is the value measured in Eq. 1 (Eq. 2); and Using different nodal analysis and/or different methods to change the state of the circuit, different equations may be derived and implemented from the two modes of operation.

Figure 5:
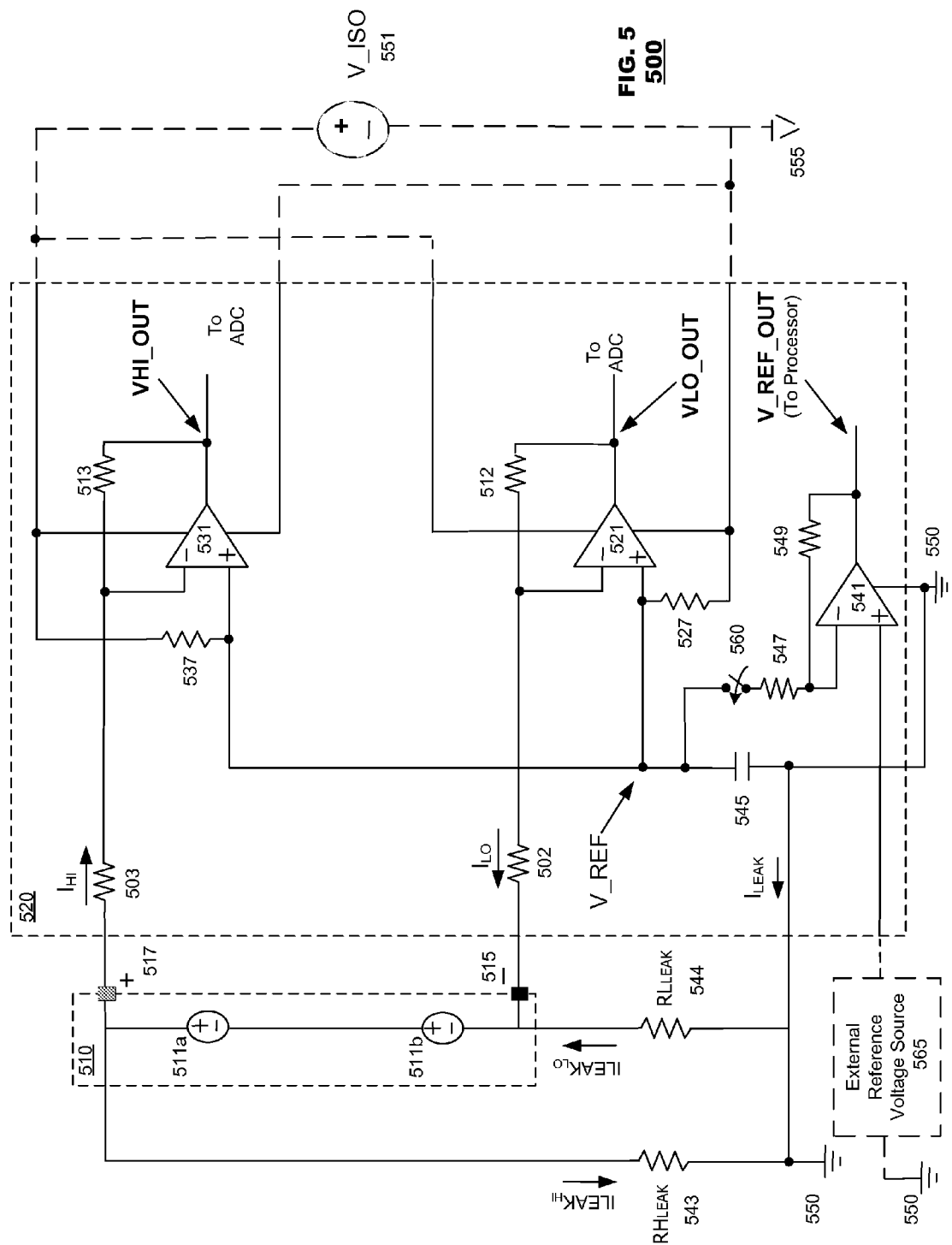
FIG. 5 illustrates an alternative exemplary circuit according to another embodiment of the present invention.

FIG. 5 illustrates an exemplary circuit 500 according to another embodiment of the present invention. The topology of the circuit 500 and its elements therein are substantially the same as circuits 200 and 300 described above with respect to FIGS. 2 and 3, respectively, so further description will be limited with respect to the specific configuration of circuit 500. The operational principles of the circuits 200 and 300 can apply to the circuit 500 of FIG. 5.

FIG. 5 illustrates an alternative configuration for modeling the leakage impedance of the battery stack 310 shown in FIG. 3. FIG. 5 illustrates a battery 510 with a leakage impedance path modeled by leakage resistor 543 (RHLEAK) and leakage resistor 544 (RLLEAK). The leakage resistor 543 may be coupled between the positive (+) terminal 517 of the battery stack 510 and the chassis 550. The leakage resistor 544 may be coupled between the negative (−) terminal 515 and the chassis 550. When leakage current $ILEAK_{HI}$ or $ILEAK_{LO}$ are present flowing through leakage resistors 543 or 544, respectively, a leakage voltage (e.g., the voltage between the positive (+) terminal 517 and the chassis 550 and/or the voltage between the negative (−) terminal 515 and the chassis 550) may be present across leakage resistors 543 and 544.

As discussed above, the model for the battery leakage in FIG. 3 provides two unknowns (e.g., offset voltage and the leakage resistance) that can be determined by taking two readings with a changed parameter of the circuit 300 to provide two different operational states. Similarly, the model for the battery leakage in FIG. 5 provides two unknowns (e.g., leakage resistors 543 and 544) that can be determined by taking two readings with a changed parameter of the circuit 500.

FIG. 5 illustrates a leakage event modeled as leakage resistors 543 and 544 extending respectively from the positive and negative terminals of the battery stack 510 to chassis ground 550 and by leakage currents extending through those resistors (represented as an aggregate current ILEAK). When ILEAK HI equals ILEAK LOW (i.e., symmetric leakage) no current would flow through the capacitor 545 or resistor 547 (with switch closed). Thus, the voltage V_REF_OUT may be equal to the voltage provided by the external voltage source 565. The voltage input to the non-inverting terminals (V_REF) of the amplifiers 521 and 531 would be chassis ground 550.

When leakage events occur and is asymmetrical, currents of magnitudes may flow through the leakage resistors 543 and 544. When the leakage currents have asymmetric properties, a net current $I_{LEAK}$ (which may be positive or negative with respect to the arrow illustrated in FIG. 5) may flow through the capacitor 545 and resistor 547 (with switch closed). Thus, the voltage at the non-inverting inputs of the amplifiers 521 and 531 may deviate from chassis ground

550. After the reference capacitor 545 charges, the full $I_{LEAK}$ current may pass through reference resistor 547 and reference feedback resistor 549. The $I_{LEAK}$ current through the resistors 547 and 549 may cause a voltage to be present at the output of amplifier 541. After a predetermined time, the output of amplifier 541 may be sampled by the processor (not shown) to obtain one of the readings for one state of the circuit.

As discussed above with reference to FIGS. 2 and 3, various components may be varied to obtain two different states of the circuits, such that the leakage parameters can be determined using one of the above discussed models. The components that may be varied in FIG. 5 include one or more of the input resistor 502, the input resistor 503, the reference resistor 547, or the external reference voltage supply 565, or any combination thereof. For example, the reference resistor 547 may be set to infinity to obtain a first state of the circuit and to a finite value to obtain a second state of the circuit. In another embodiment, a resistor can be provided in parallel with the capacitor 545 to change the operational state of the circuit 500.

Furthermore, the reference capacitor 245, 345 or 545, in FIG. 2, 3 or 5, respectively, may be replaced by a component that provides a set impedance. For example, the reference capacitor 245, 345 or 545 may be replaced by one or more resistors, or a variable resistor. The impedance may be varied to provide the two states of the circuit. The impedance may be changed in response to a signal from a processor/controller (not shown).

The structure of the detection circuits shown in FIGS. 3 and 5 may have certain disadvantages. First, the resistors may need to remain large enough to minimize power dissipation and thermal self heating errors. The large resistances of the input resistors 302 and 303 in conjunction with one or more capacitors from node 317 to chassis 350 and from node 315 to chassis 350 (phantom system capacitors not shown in FIGS. 3 and 5) may result in a relatively large RC time constant. This can lead to relatively large and undesirable settling times between samplings (the settling time can be 7 seconds, in some implementations). This may create issues of resolving valid samples due to long transient settling time caused by charging/discharging the battery 310. Even if smaller values are used for the input resistors 302 and 303 to minimize the settling time, the amount of power dissipation may increase to an extent that is undesirable.

Second, the reference voltage generator may include active components, such as another operational amplifier, which can create an error source. Third, when resistor values (e.g., resistor 347, 302, and/or 303) are modified to change circuit parameters in order to calculate the leakage, additional high voltage resistor strings and high voltage switches may be required. Fourth, the measurements of the amplifiers 321 and 331 may be difficult to synch with the measurements of the amplifier 341 because the outputs are provided on different sides of the isolation barriers. Last, because the outputs VHI_OUT, VLO_OUT, and V_REF_OUT as shown in FIG. 3 are functions of the battery voltage, the battery voltage may need to be known and simultaneously sampled with other readings, and the battery voltage changes between the readings may need to be accounted for in the analysis. One or more of these disadvantages may also apply to the circuit shown in FIG. 5 in some applications.

In summary, sampling of all voltages synchronized to battery voltage measurements may require multiple ADCs that are sampled simultaneously, where some ADCs are referenced to chassis 350 and some are referenced to isolated supply's 351 common node 355. This may add cost and may become difficult to implement.

Figure 6:
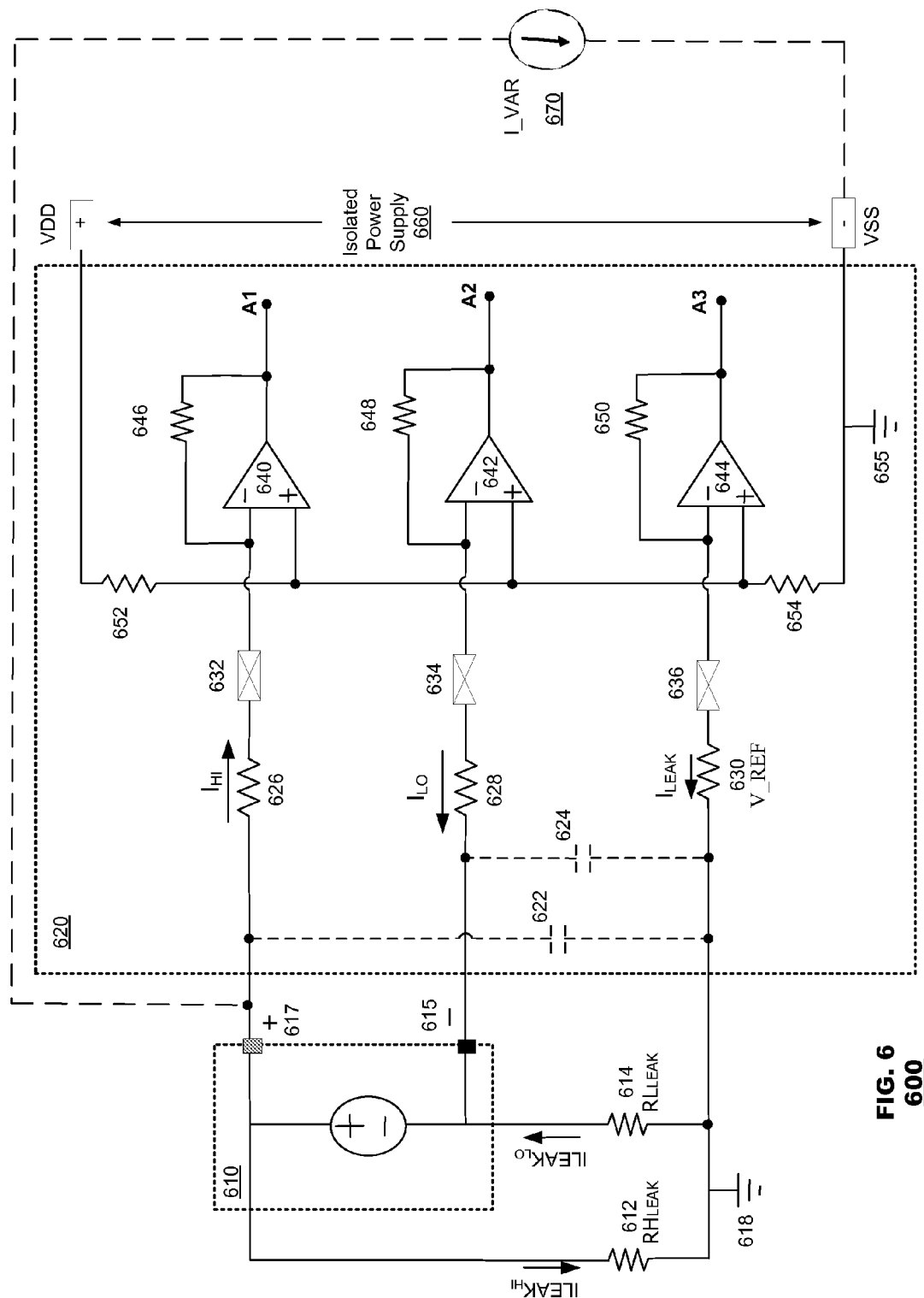
FIG. 6 is a circuit schematic depicting an improved exemplary embodiment of the present invention.

FIG. 6 is a circuit schematic 600 depicting an improved exemplary embodiment of the present invention. The circuit 600 in FIG. 6 overcomes one or more of the disadvantages discussed above with reference to FIGS. 3 and 5. The advantage of the embodiment shown in FIG. 6 may include, faster settling times, less susceptibility to the battery noise and fluctuations (e.g., when under load and/or charging), no requirement for a changing resistor string, no requirement for syncing measurements between outputs, no requirement for syncing measurements to battery voltage, no requirement for an extra reference voltage source and obtaining results that are independent of the battery stack voltage. For example, unlike other circuits that require the battery voltage to be known, the circuit 600 can be used to determine leakage impedance independent of the battery voltage. In addition, because the settling time of the circuit 600 is fast and the results are independent of the battery voltage, much more latitude is provided in changing states and reading the measurements of the circuit 600 during battery transients. As will be discussed in more detail below, such circuit also allows for ratiometric measurements to be made from the outputs of the circuit 600.

FIG. 6 illustrates the leakage impedance path modeled by a leakage resistor 612 (RHLEAK) and a leakage resistor 614 (RLLEAK). The leakage resistors 612 and 614 can model the leakage impedance inherent to the system. However, the leakage impedance model shown in FIG. 3 may also be used with the circuit 600 shown in FIG. 6.

The circuit schematic 600 may include the battery stack 610, the detection circuit 620, an isolated power supply 660 and a current source 670. The battery stack 610 may include a negative (−) terminal 615 and a positive (+) terminal 617. The leakage impedance path of the battery stack 610 may be modeled by a first leakage resistor 612 and a second leakage resistor 614. The detection circuit 620 may include capacitors 622, 624 (the capacitors 622 and 644 are shown in phantom as they are inherent to the system), input resistors 626, 628, a primary resistor 630, amplifiers 640, 642, 644, feedback resistors 646, 648, 650, and bias resistors 652 and 654. The circuit schematic 600 may include chassis (reference ground potential) 618 and isolated ground 655. The circuit 600 may also include one or more of enable switches 632, 634 and an isolation switch 636.

As shown in FIG. 6, the positive (+) terminal 617 of the battery stack 610 may be coupled to an inverting input of the amplifier 640 via the input resistor 626 and optionally the enable switch 632. The negative (−) terminal 615 of the battery stack 610 may be coupled to an inverting input of the amplifier 642 via the input resistor 628 and optionally the enable switch 634. Only one of the switches 632 and 634 may be used in the circuit to enable the operation of the circuit 600. The chassis 618 (e.g., chassis of the vehicle in which the battery stack 610 may be located) may be coupled to an inverting input of the amplifier 644 via the primary resistor 630 and the enabling isolation switch 636. The switch 632 and/or switch 634 may be a logic level control referenced to isolated ground 655 (e.g., high voltage MOSFET, but is not so limited). The switches 632, 634 may be selected to withstand the battery voltage. The isolation switch 636 may be selected to maintain the isolation requirements between the high voltage domain and the low voltage domain of the circuit 600.

The leakage resistor 612 may be coupled between the positive (+) terminal 617 of the battery stack 610 and the chassis 618. The leakage resistor 614 may be coupled between the negative (−) terminal 615 and the chassis 618. The leakage current $ILEAK_{HI}$ may represent the leakage current from the positive (+) terminal 617 of the battery stack 610 to the chassis 618 and the leakage current $ILEAK_{LO}$ may represent the leakage current from the chassis 618 to the negative (−) terminal 615 of the battery stack 610. When leakage current $ILEAK_{HI}$ or $ILEAK_{LO}$ are present through leakage resistors 612 and 614, respectively, and the leakage current $ILEAK_{HI}$ and $ILEAK_{LO}$ are not equal, a leakage current $I_{LEAK}$ may be present through resistor 630 producing a voltage V_REF across resistor 630 reference to chassis 618.

Each of the amplifiers 640, 642, 644 have inputs, power supply connections and an output as is known in the art. As shown in FIG. 6, all of the amplifiers 640, 642, 644 may be provided on the same side of the isolation barrier. The amplifiers 640, 642, 644 may each have a non-inverting input terminal connected to a node between a first terminal of the bias resistor 652 and a first terminal of the bias resistor 654. A second terminal of the bias resistor 652 may be coupled to a first supply voltage VDD. A second terminal of the bias resistor 654 may be coupled to a second supply voltage VSS. The first supply voltage VDD can be a positive supply voltage and the second supply voltage VSS can be a negative supply voltage, a lowest negative supply voltage or the isolated ground 655 (e.g., floating ground). The first supply voltage VDD and the second supply voltage VSS may be provided by the isolated power supply 660.

Each of the amplifiers 640, 642 or 644 may be connected in an inverting configuration with a feedback resistor 646, 648 or 650, connected to their respective inverting inputs. Bias resistor 652, 654 may be sized to bias the non-inverting inputs of the amplifiers 640, 642 and 644 to a potential relative to the isolated ground 655. Of course, other components or devices may be substituted for bias resistors 652 and 654 to provide the same function.

Because the amplifiers 640, 642 and 644 may be configured in an inverting configuration, the feedback resistors 646, 648 and 650 may be connected to both the inverting input and the output of the respective amplifiers 640, 642 and 644. The input resistors 626 and 628 may be of equal resistance value, and may have a resistance value of approximately 300K to 2M ohms, but are not so limited. The feedback resistors 646, 648 and 650 may have a resistance value orders of magnitude smaller than the resistance values of input resistors 626 and 628, but are not so limited. The feedback resistors 646, 648 and 650 may have the same resistance values. Resistor 630 may have a value large enough to maintain isolation between the high voltage domain and the low voltage domain of the circuit 600 (e.g., between the chassis 618 and the isolated ground 655).

The switches 632 and 634 may provide control to enable the circuit 600 to operate and the isolation switch 636, when open, may provide isolation (e.g., galvanic isolation) between the high voltage domain of the battery pack 610 and the low voltage domain of the detection circuit 620, the ADC (not shown in FIG. 6) and/or the processor (now shown in FIG. 6). Switches 632 and 634 may be logic level MOSFETs whose control is referenced to the isolated ground 655, which may be activated by a signal from a processor through the isolation barrier. The breakdown voltage requirements of switches 632 and 634 may be based on the battery stack voltage. The isolation switch 636 may be selected to maintain the isolation requirements between the high voltage domain and the low voltage domain of the circuit 600. The isolation switch 636 may be actuated by a signal from the processor/controller (now shown in FIG. 6). The switches 632 and 634 and the isolation switch 636 may be a transistor, MOSFET, relay, photo-MOS, microelectromechanical systems (MEMS) isolators, optoelectronic transceivers, capacitors, micro-transformers or other switch as is known in the art.

The resistors 626, 628 and 630 and the switches 632, 634 and 636 may be implemented by one or more resistors, which may be variable resistors. Other components can also be used to implement the operation of the resistor and/or the switch.

The switch 632 when closed, may complete a circuit path connecting a first terminal of the input resistor 626 and the inverting input of the amplifier 640. The switch 634 when closed, may complete a circuit path connecting a first terminal of the input resistor 628 and the inverting input of the amplifier 642. The isolation switch 636 when closed, may complete a circuit path connecting a first terminal of the primary resistor 630 and the inverting input of the amplifier 644. The capacitor 622 may be coupled between the second terminal of the input resistor 626 and the chassis 618. The capacitor 624 may be coupled between the second terminal of the input resistor 624 and the chassis 618. The capacitors 622 and 644 are shown in phantom as they are inherent to the system.

The detection circuit 620 may be connected to, or include, the isolated power supply 660. The isolated supply 660 may connect negative and positive terminals to the amplifiers 640, 642 and 644, and the negative terminal may connect to the isolated ground 655. The positive terminal of the isolated power supply 660 may connect to the positive power supply terminal (not shown in FIG. 5) of the amplifiers 640, 642 and 644 and to the second terminal of the bias resistor 652. The first terminal of the bias resistor 652 may connect to the non-inverting terminals of the amplifiers 640, 642 and 644. The negative terminal of the isolated power supply 660 may connect to the negative power supply terminals (not shown in FIG. 6) of the amplifiers 640, 642 and 644, and to the second terminal of the bias resistor 654. The first terminal of the bias resistor 654 may connect to the non-inverting terminals of the amplifiers 640, 642 and 644.

As discussed above with reference to FIGS. 3 and 4, various components may be varied to obtain two different states of the circuit, such that the leakage parameters may be determined. The two different states of the circuit can be used to generate two sets of output values (outputs from the amplifiers 640, 642 or 644) such that that two unknown (e.g., the leakage resistors 612 and 614) may be determined. However, as discussed above with reference to FIGS. 3 and 5, and with many conventional systems, changing the values of various components of the circuit may results in long setting time between measurements, and may require additional resistor strings or switches or may need active components. In addition, the measurements in such systems or methods may need to take account for battery changes and/or may need for the sampling from the different outputs to be performed simultaneously. To overcome some of these disadvantages, a current source 670 can be added as shown in FIG. 6.

The current source 670 may provide current to a node of the battery stack 610 to change the state of the circuit 600. For example, the current source 670 may provide current to the negative (−) terminal 615, the positive (+) terminal 617, or a node within the battery stack 610 (not shown in FIG. 6). Unlike in the other techniques where providing the two states of the circuit changes the impedance that the battery sees, providing a current to a node of the battery stack 610 does not change the impedance that the battery sees. The current source 670 may produce a current from one of the terminals (VSS or VDD) of the isolated power supply 660 to provide the current to some node of the battery 610. The current provided by the current source 670 may have a negative (−) or a positive (+) value.

As shown in FIG. 6, the current source 670 may connect to a node of the battery stack 610. In FIG. 6, the current source 670 may be disposed between the positive (+) terminal 617 of the battery stack 610 and one of the terminals of the isolated power supply 660 (first supply voltage VDD or the second supply voltage VSS). However, as mentioned above, in an alternative embodiment, the current source 670 may be coupled between the negative (−) terminal 615 and one of the terminals of the isolated power supply 660 (first supply voltage VDD or the second supply voltage VSS). The current source 670 is not limited to the configuration mentioned above in FIG. 6. The current source 670 may be coupled to the isolated ground 655, the chassis 618 or any other node of the circuit 600. The current source 670 may be an external current source that couples to any node of the battery stack 610 to control the state of the circuit 600.

The current source 670 may be a variable current source. The current source 670 may be a MOSFET (e.g., comprising one or more of n-channel MOSFETs or p-channel MOSFETs or any combination thereof). The current source 670 may provide current having multiple predetermined values (e.g., values between 100 mA and 1 mA, but is not so limited). In one example, to provide the two states of the circuit 600, the current source 670 may provide no current for the first state and provide current with a predetermined value for the second state.

Alternatively, the current source 670 may provide current with a value that is a function of one or more of the outputs A1, A2 and/or A3 of the amplifiers 640, 642 or 644, respectively. For example, the current source 670 may be ratiometric of one or more of the current values provided at the outputs A1, A2 and/or A3 (e.g., scaled value thereof). As a specific example, the value of the current provided by the current source 670 may be ratiometric of the output A2 of the amplifier 642 (e.g., for a first state of the circuit 600 the current source 670 may provide current having a value that is a function of the output A2 (e.g., the current flowing through resistor 648) and for a second state of the circuit 600 the current source 670 may provide current having a value that corresponds to one half of the current flowing through resistor 648. Using the outputs A1, A2 and/or A3 of the amplifiers 640, 642 or 644 to regulate the value of the current supplied by the current source 670 allows for the nodes 615 and 617 of the battery 610 to be maintained within a reasonable range relative to the chassis 618. Keeping the nodes of the battery 610 within a reasonable range prevents the circuit components from exceeding their ratings. Thus, the current source 670 may be a self regulated current source. In another example, the current source 670 may provide no current for the first state and provide current with a value that is a function of the output A2 of the amplifier 640 for the second state.

As discussed above, making the current of the current source 670 a function of one or more of the outputs A1, A2 and/or A3 of the amplifiers 640, 642 or 644, respectively, may keep node 617 reference to chassis 618 and node 615 reference to chassis within a usable range. The usable range may be determined by the components (e.g., isolation switch 636) used in the circuit 600. That is, if the voltages a node 617 reference to chassis 618 and node 615 reference to chassis becomes too large, then the switches 632, 634 and 636 may exceed their breakdown voltage when open or resistors 626, 628, 630 may exceed their safe operating range (e.g. power dissipation rating) when switches 632, 634, 636 are closed.

The outputs A1, A2 and A3 of the detection circuit 620 may be provided to a single ADC through a multiplexer (not shown in FIG. 6). The ADC may convert the signals to a digital signal, which may be output to a processor/controller (not shown in FIG. 6) for processing. The processor may sample the values at predetermined intervals, which may change based on changes in the sampled values. The outputs A1, A2 and A3 may be used to determine characteristics of the leakage impedance and/or leakage voltage, and/or to determine the battery stack 610 voltage. Because the outputs A1, A2 and A3 are provided on the same side of the isolation barrier and simultaneous measurements are not required (as discussed below), the outputs A1, A2 and A3 may be read by a single ADC sequentially. For example, the outputs A1, A2 and A3 may be read by including a multiplexer with a single ADC. As will be discussed below, unlike in the prior art, simultaneous measurements are not required to resolve leakage resistors 612 and 614.

With reference to FIG. 6, the currents $I_{HI}$ and $I_{LOW}$, over the input resistors 626 and 628, respectively, may be substantially equal without the presence of leakage impedance. Because the input resistors 626 and 628 may be matched, the voltage drop across input resistor 626 can be equal to, but of opposite polarity to, the voltage drop across input resistor 628. This leaves an equal voltage potential, but of opposite polarity, on the respective nodes 615 and 617 relative to chassis 618. The battery stack 610 voltage may be substantially equal to the sum of the voltage drops across the input resistors 626 and 628 without the leakage impedance.

To determine the leakage impedance, measurements can be taken from the outputs A1, A2 and A3 at two different states of the circuit 600. Bridging the constant current source 670 from a node of the isolated supply 660 to a node of the battery stack 610 and changing the value of the current source 670 between two values may provide two states of the circuit 600 to resolve leakage resistors 612 and 614. For example, two currents (positive or negative) may be sequenced with the current source 670 on one of the nodes of the battery stack 610 from the isolated power supply 660 to change the value of the outputs A1, A2, and A3 on the amplifiers 640, 642 or 644. The known parameters of the detection circuit 620 and the values of the outputs A1, A2 and A3 (referenced to isolated ground 655) measured at two different states of the circuit 600 may be used to determine values of the leakage impedance components.

Using standard nodal analysis, the following equations may be derived to determine a value for the leakage resistor 612 and the leakage resistor 614:

$$R_{612} = R_{630}\left[\frac{Gain_{640}(A1_A * A2_B - A1_B * A2_A)}{Gain_{644}(A3_A * A2_B - A3_B * A2_A)} + \frac{Gain_{640}(A3_A * A1_B - A3_B * A1_A)}{Gain_{642}(A3_A * A2_B - A3_B * A2_A)} - 1\right] \quad \text{Eq. 3}$$

$$R_{614} = -R_{630}\left[\frac{Gain_{642}(A1_A * A2_B - A1_B * A2_A)}{Gain_{644}(A3_A * A1_B - A3_B * A1_A)} + \frac{Gain_{642}(A3_B * A2_A - A3_A * A2_B)}{Gain_{640}(A3_A * A1_B - A3_B * A1_A)} + 1\right] \quad \text{Eq. 4}$$

In equations 3 and 4, subscripts A and B indicate the values of outputs A1, A2 and A3 sampled at different states of the circuit 620 (e.g., state A and state B). Each state A, B may correspond to a different time at which the measurement of the circuit 600 is taken. The value of the current supplied by the current source 670 may be changed between the two states. For example, at state A, the outputs may be sampled while the current source 670 provides a current having a first value to one of the nodes of the battery stack 610 and at state B, the outputs may be sampled again while the current source 670 provides a current having a second value to one of the nodes of the battery stack 610. As can be seen in equations 3 and 4, the value of the leakage resistors is independent of the battery stack 610 voltage and independent of the current source 670.

The gain of the amplifiers 640, 642 or 644 in equations 3 and 4 may be determined by the resistors (e.g., feedback resistor and input resistor) connected to each amplifier. The gain of the amplifier may correspond to the input resistor (e.g., resistor 626, 628 or 630) divided by the feedback resistor (e.g., resistor 646, 648 or 650). The gain of each amplifiers 640, 642 or 644 may be known based on the values of the resistors connected to each amplifier.

The configuration of the circuit 600 allows for the leakage resistor 612 and the leakage resistor 614 to be resolved ratiometrically relative to the battery voltage (e.g., in an ADC—not shown in FIG. 6). With ratiometric measurements the ADC's reference voltage may be proportional to the battery voltage (e.g., 1 volt reference for 100 volt battery) rather than a fixed value. Therefore, the circuit does not require a fixed reference, and allows the measurement of the amplifiers 640, 642, and 644 to be made sequentially.

In circuit 600, the ratiometric measurements can be made independent of the absolute battery voltage. This allows for sequential measurements to be made at outputs A1, A2 and A3 even when the voltage of the battery changes between the subsequent measurements. The ratiometric measurements may be based on (but not limited to) the outputs A2 minus A1 representing the full scale reference (e.g., 4096 counts representing the full scale count in a 12-bit ADC). Thus, even if the voltage at the nodes of the battery change between the subsequent measurements, the readings at the outputs A1, A2 and A3 can be based on the ratios of the readings. The ADC (not shown in FIG. 6) can directly convert the output voltages of the amplifiers 640, 642, and 644 to an ADC count that is independent of battery voltage.

Therefore, the following equations may be used to determine a value for the leakage resistor 612 and the leakage resistor 614 based on the ratiometric measurements:

$$R_{612} = R_{630}\left[\frac{Gain_{640}(N_{A1A}*N_{A2B} - N_{A1B}*N_{A2A})}{Gain_{644}(N_{A3A}*N_{A2B} - N_{A3B}*N_{A2A})} + \frac{Gain_{640}(N_{A3A}*N_{A1B} - N_{A3B}*N_{A1A})}{Gain_{642}(N_{A3A}*N_{A2B} - N_{A3B}*N_{A2A})} - 1\right] \quad \text{Eq. 5}$$

$$R_{614} = -R_{630}\left[\frac{Gain_{642}(N_{A1A}*N_{A2B} - N_{A1B}*N_{A2A})}{Gain_{644}(N_{A3A}*N_{A1B} - N_{A3B}*N_{A1A})} + \frac{Gain_{642}(N_{A3B}*N_{A2A} - N_{A3A}*N_{A2B})}{Gain_{640}(N_{A3A}*N_{A1B} - N_{A3B}*N_{A1A})} + 1\right] \quad \text{Eq. 6}$$

In equations 5 and 6, N represents the count of a counting type ADC for the respective amplifier output A1, A2 or A3 at two states A, B of the circuit 600. Each state A, B may correspond to a different time at which the measurement of the circuit 600 is taken. The circuit 600 and equations 5 and 6 allow for the measurements to be made independent of the battery stack 610 voltage and independent of the current source 670. The only error terms in equations 5 and 6 are from the gain resistor tracking of the amplifiers 640, 642, 644 and/or absolute value of resistor 630.

Each count may represent one part of the full scale representation. The full scale representation may be defined by the resolution of the ADC. For example, in a 12-bit ADC, 4096 (i.e., 2^12) counts may represent a full scale representation. The above equations may be applied to other types of ADCs, where N represents the digital value determined by the ADC for the respective amplifier output A1, A2 or A3 at two states A, B of the circuit 600.

The outputs A1, A2 and/or A3 of the amplifiers 640, 642 or 644 may also be used to perform diagnostics on the performance of the circuit 600. Performing the diagnostic may include measuring the outputs A1, A2 and/or A3 while providing a current to a node of the battery 610 using the current source 670 with a value that is ratiometric to one or more of the outputs A1, A2 and/or A3. The diagnostics may be performed based on the following equation:

$$I_{VAR} + I_{HI} = I_{LEAK} + I_{LO} \quad \text{Eq. 7}$$

In equation 7, $I_{VAR}$ represents the current value of the current source 670, $I_{HI}$ represents the current value flowing through resistor 646, $I_{LO}$ represents the current flowing through resistor 648, and $I_{LEAK}$ represents the current flowing through resistor 650. $I_{VAR}$ in equation 7 can be replaced if $I_{VAR}$ is set to a be a function of one or more of the amplifiers 640, 642 or 644 outputs. For example, if $I_{VAR}$ is set to a be a function amplifier 642 output (e.g., current $I_{LO}$ flowing through resistor 648), then $I_{VAR}$ can be replaced with $K*I_{LO}$ to obtain:

$$I_{HI} = I_{LEAK} + I_{LO}(1-K) \quad \text{Eq. 8}$$

In equation 8, K is a constant representing the relationship of $I_{VAR}$ to $I_{LO}$. The values of resistors 646, 648 and 650 may be assumed to be equal. As shown in equation 8, if the relationship of $I_{VAR}$ to the other currents is known, the equation is independent of the $I_{VAR}$ value. While equation 8 shows the relationship of the currents when $I_{VAR}$ is a function of $I_{LO}$, $I_{VAR}$ in equation 7 can be set to be a function of any one or more of the amplifiers 640, 642 or 644 outputs.

$$N_{A1} = N_{A3} + N_{A2}(1-K) \quad \text{Eq. 9}$$

Equation 9 may be used when the current values are converted to a digital count representation by an ADC with the ADC's reference being output of A2 minus the output A1. In equation 9, N represents the count of the ADC for the respective amplifier output A1, A2 and A3. With outputs A2 minus A1 used as a reference for the ADC, proper operation can also be checked represent the full scale count This is represented in equation 10 below.

$$N_{Full\_Scale} = N_{A2} - N_{A1} \quad \text{Eq. 10}$$

One or more of the equations 7-10 may be used to perform diagnostics of the circuit 600. The diagnostic may include determining whether the circuit 600 is operating properly or whether the outputs from the amplifiers were sampled after the circuit settled. For example, using equation 10, if the ADC count when measuring A2 minus the ADC count when measuring A1 does not approximately correspond to the full scale (e.g., 4096 counts representing the full scale count in a 12-bit ADC), then the circuit may not be operating properly or measurements may have been invalid (e.g., measurement were taken when the circuit was not settled). In another example using equation 9, if the value of the current source 670 is set equal to $I_{LO}$ then K=1 and $N_{A1}$ should approximately equal $N_{A3}$. This allows for a diagnostic check to ensure that the circuit 600 is performing properly and the circuits have settled when data was taken. Although outputs A1 and A2 are used as reference for the ADC, the embodiments are not so limited. Other outputs of the circuit 600 may be used as a reference for the ADC to perform the diagnostics of the circuit 600. In addition, as discussed above, the value of the current source 670 may be set to be a function of any one or more of the outputs A1, A2 and/or A3 of the circuit 600.

Figure 7:
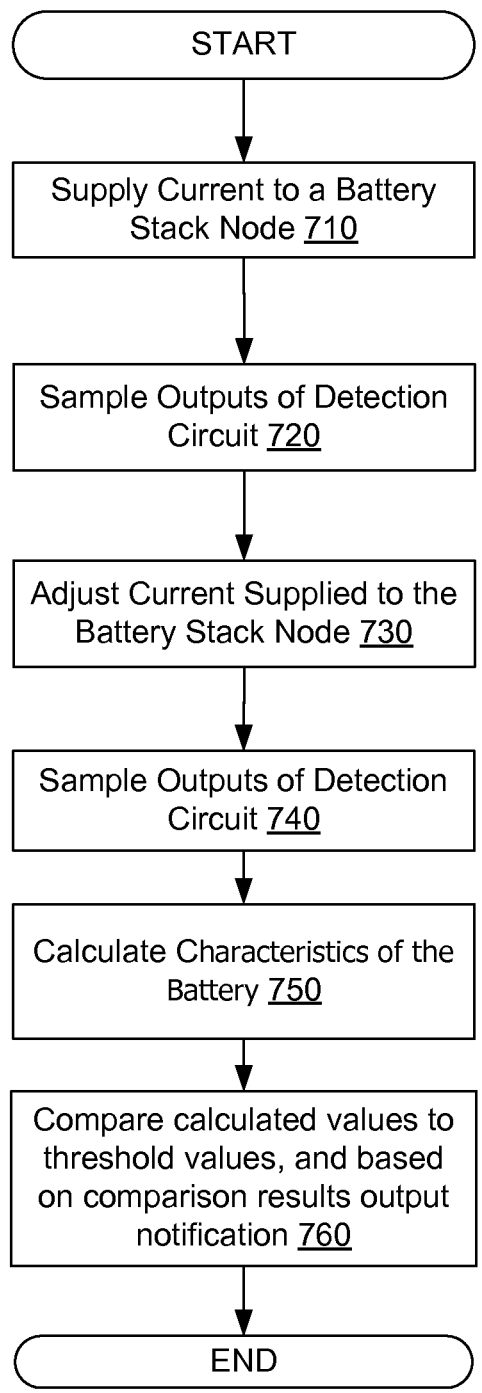
FIG. 7 illustrates an alternative exemplary method for processing the measurements of a detection circuit according to an embodiment of the present invention.

FIG. 7 illustrates an exemplary method 700 for processing the measurements of a detection circuit according to an embodiment of the present invention. The method of FIG. 7 may be used in relation to the circuit 600 discussed above. At step 710 of the exemplary process 700, current may be supplied to a node of the battery. The current may be supplied in response to a control signal provided by the processor. The current provided may have a predetermined value or may be a function of one or more of the outputs of the detection circuit (e.g., outputs A1, A2 or A3 of the detection circuit 620 shown in FIG. 6). Step 710 may be optional, if for the first state of the circuit no current is provided to the node of the battery.

The outputs of the detection circuit may be sampled at step 720. The sampling may be performed by an independent ADC and/or a processor including an ADC. To ensure that the circuit is settled at the time the sampling is performed, the outputs may be sampled after a predetermined time from setting the supply current. In another embodiment, to ensure that the circuit is settled at the time the sampling is performed, the measurements for the outputs can be repeated until subsequent measurements are approximately the same. The sampling of multiple outputs may be performed sequentially using an ADC and a multiplexer (mux) or simultaneously using multiple ADCs. The sampled values may be stored in a memory. Once the outputs A1, A2, and A3 have been sampled at 720, the current supplied to the node of the battery may be adjusted at step 730. The adjusted value of the current may be a predetermined value or a function of one or more of the outputs of the detection circuit (e.g., outputs A1, A2 or A3 of the detection circuit 620 shown in FIG. 6).

The outputs of the detection circuit may be sampled again at step 740. As discussed above for step 720, the sampling may be performed to ensure that the circuit is settled. The sampled values may be stored in a memory. The sampled values of the outputs from steps 720 and 740 may be used to calculate the leakage impedance value (e.g., based on equations 5 and 6) at step 750. The values calculated at step 750 may be compared at step 760, to threshold values that may be stored in memory. Based on the results of the comparison, a notification may be sent to an output device.

FIG. 8 illustrates an exemplary method 800 for processing the measurements of a detection circuit according to another embodiment of the present invention. The method 800 may be used with the circuit 600 shown in FIG. 6. The method 800 may include setting a supply current (e.g., supply current 670 shown in FIG. 6) to provide a first state of the circuit at step 810. The supply current may be provided to one of the nodes of a battery stack being measured by the circuit. In step 820, a first output (e.g., amplifier output A1 in FIG. 6) may be sampled. The first output may be sampled after ensuring the circuit settles. In step 830, a second output (e.g., amplifier output A2 in FIG. 6), may be sampled. The second output may be sampled after ensuring the circuit settles. To ensure that the circuit settles, the outputs may be sampled after a predetermined time from setting the supply current. In another embodiment, to ensure that the circuit settles, the measurements for the outputs can be repeated until subsequent measurements are approximately the same. The sampled values of the first output and the second output may be stored in a memory after being sampled.

By means of equation 10, a test may be performed in step 840 using the first reading (A1) and second reading A2. The test may include determining whether the circuit is operating correctly and/or whether the values at the outputs were settled when the sampling was performed. The test may include determining whether the difference between the second sampled value and the fist sampled value provides approximately a full scale count (e.g., in a 12-bit ADC, 4096 counts may represent a full scale representation). If the difference of the values does not result a full scale count, then the circuit may not be operating correctly and/or the values at the outputs were not settled when the sampling was performed. If the difference of the sampled values does not provide a full scale count, the sampling of the first output (step 820) and the second output (step 830) may be repeated until full scale count is obtained. A notification may be provided each time a full scale count is not obtained in step 840 or after the full scale count is not obtained a predetermined number of times. If step 840 results in a full scale count, then step 850 may be performed.

In step 850, a third output may be sampled (e.g., amplifier output A3 in FIG. 6). The third output may be sampled after ensuring the circuit settles. The third output may be sampled to obtain a digital value (e.g., count of third output). The sampled values of the third output may be stored in the memory after sampling.

After the third output is sampled, a test may be performed in step 860 (e.g., using equation 8 or 9) to determine whether the circuit is operating correctly and/or whether the values at the outputs were settled when the sampling was performed. If equation 8 or 9 is not verified, then the circuit may not be operating correctly and/or the values at the outputs were not settled when the sampling was performed. Then the sampling may be repeated for one or more of the outputs. For example, the sampling may be repeated for only the third output (step 850) or for all three outputs (steps 820, 830 and 850). A notification may be provided if the test in step 860 does not pass. The test in step 840 may be performed at step 860. One or both of the tests performed in steps 840 and 860 may be omitted.

In step 870, a determination may be made to see if two sets of values have been sampled for each of the outputs. If two sets of values have not been sampled, then in step 880, the supply current may be set to provide a second state of the circuit. If two sets of value have been sampled, then an analysis may be performed (e.g., using equations 5 and 6) in step 890 to determine the values of the leakage components.

The methods discussed above to test the operation of the circuit may be performed without the battery (e.g., battery 610) being connected to the circuit. A temporary source may be provided in place of the battery. This source may be a provided using a power supply from the chassis side or from the isolated power supply. The same operations discussed above may be performed to test the operation of the circuit. Thus, the circuit may be tested before a battery is connected to the circuit.

While the methods discussed above show the sampling of the outputs A1, A2 and/or A3 being performed sequentially, in another embodiment, the sampling of multiple outputs may be performed simultaneously. Performing the samplings sequentially may reduce cost by using a single ADC. Simultaneous sampling may be performed by utilizing multiple ADCs.

Although the processes illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

While various aspects of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method for identifying a presence of a leakage path in a floating voltage source, comprising:
    supplying a current to a node of the floating voltage source;
    sampling the voltage of the floating voltage source using a pair of amplifiers connecting in inverting configurations, wherein each of the pair of amplifiers outputs an output signal;
    sampling a reference ground potential using a reference amplifier connected in an inverting configuration, wherein the reference amplifier outputs a reference output signal;
    adjusting the current supplied to the node of the floating voltage source;
    resampling the voltage of the floating voltage source and the reference ground potential; and
    calculating a value of a leakage impedance using the sampled and resampled values.

2. The method of claim 1, further comprising comparing the calculated value of the leakage impedance with a threshold value.

3. The method of claim 2, further comprising generating a notification when the threshold value is exceeded.

4. The method of claim 2, wherein comparing further comprises accessing a memory to retrieve a stored threshold value.

5. The method of claim 1, further comprising storing the sampled and resampled outputs and reference outputs in a memory.

6. The method of claim 1, wherein supplying further comprises generating the current as a function of one or more outputs of the pair of amplifiers and the reference amplifier.

7. The method of claim 1, wherein sampling comprises sampling the outputs of the pair of amplifiers and the reference amplifier sequentially.

8. The method of claim 1, wherein sampling comprises sampling the outputs of the pair of amplifiers and the reference amplifier simultaneously.

9. A system for determining a leakage impedance of a floating voltage source, comprising:
    a detection circuit comprising:
        a first amplifier and a second amplifier, a first input of the first amplifier coupled to a first terminal of the floating voltage source and a first input of the second amplifier coupled to a second terminal of the floating voltage source, a second input of each of the first and second amplifiers coupled to a reference voltage; and
        a third amplifier, a first input of the third amplifier coupled to a reference ground potential and a second input of the third amplifier coupled to the reference voltage;
    a processor for processing outputs of the first, second and third amplifiers to determine the leakage impedance; and
    a current source coupled to the floating voltage source.

10. The system of claim 9, wherein a current supplied by the current source is a function of at least one output of the first, second and third amplifiers.

11. The system of claim 9, further comprising;
    a first switch disposed between the first input of the first amplifier and the first terminal of the floating voltage source;
    a second switch disposed between the first input of the second amplifier and the second terminal of the floating voltage source; and
    a third switch disposed between a first input of the third amplifier and the reference ground potential,
    wherein at least one of the switches forms an isolation barrier between the floating voltage source and the outputs of the first, second and third amplifiers.

12. The system of claim 9, further comprising:
    an isolated power source providing power to the first, second and third amplifiers.

13. The system of claim 9, further comprises:
    an analog-to-digital converter coupled to the outputs of the first, second and third amplifiers, wherein the analog-to-digital converter provides the processor with digital signals corresponding to the outputs of the first, second and third amplifiers.

14. The system of claim 9, wherein the first, second and third amplifiers are connected in an inverting configuration.

15. A circuit, comprising:
    a first amplifier having an inverting input coupled to a first terminal of a floating voltage source, a non-inverting input coupled to a first reference potential, and an output coupled to a first output of the circuit;
    a second amplifier having an inverting input coupled to a second terminal of the floating voltage source, a non-inverting input coupled to the first reference potential, and an output coupled to a second output of the circuit;
    a third amplifier having an inverting input coupled to a second reference potential, a non-inverting input coupled to the first reference potential, and an output coupled to a third output of the circuit;
    a current source coupled to at least one of the first terminal and the second terminal of the floating voltage source;
    a first switch disposed between the inverting input of the first amplifier and the first terminal of the floating voltage source;
    a second switch disposed between the inverting input of the second amplifier and the second terminal of the floating voltage source; and
    a third switch disposed between the inverting input of the third amplifier and the second reference potential.

16. The circuit of claim 15, wherein the current source provides a current that is a function of at least one of the outputs of the first, second and third amplifiers.

17. The circuit of claim 15, further comprising one or more analog-to-digital converters to simultaneously sample the first, second and third outputs.

18. The circuit of claim 15, further comprising a multiplexer and an analog-to-digital converter to sequentially sample the first, second and third outputs.

19. The circuit of claim 15, further comprising a processor to detect a leakage impedance of the floating voltage source based on the first, second and third outputs.

20. The circuit of claim 15, further comprising a processor for diagnosing operation of the circuit based on the first, second and third outputs.

21. The circuit of claim 20, wherein diagnosing comprises determining if the circuit is settled.

22. A method for identifying leakage impedance of a floating voltage source coupled to a detection circuit, the method comprising:
sampling voltages of the floating voltage source during a first state of the detection circuit using a pair of amplifiers connected in inverting configurations;
sampling voltages of the floating voltage source during a second state of the detection circuit using the pair of amplifiers;
sampling a reference ground potential during the first state of the detection circuit using a reference amplifier connected in an inverting configuration;
sampling a reference ground potential during the second state of the detection circuit using the reference amplifier;
calculating a value of a leakage impedance using the sampled voltages and the sampled reference ground potentials for the first state of the detection circuit and the second state of the detection circuit, and
providing a current from a current source having a first value to a node of the floating voltage source to set the first state of the detection circuit and providing the current having a second value to the node of the floating voltage source to set the second state of the detection circuit.

23. The method of claim 22, wherein providing the current further comprises setting at least one of the first and second values of the current provided by the current source as a function of one or more of the amplifier outputs.

24. The method of claim 22, wherein calculating further comprises calculating the value of the leakage impedance independently of the current source and the floating voltage source.

25. A method for performing measurements using a detection circuit coupled to a floating voltage source, the method comprising:
providing a first current to one of a first terminal and a second terminal of the floating voltage source to set a first operational state of the detection circuit;
sampling an output of a first amplifier of the detection circuit to obtain a sampled output of the first amplifier for the first operational state of the detection circuit, the first amplifier coupled to the first terminal of the floating voltage source in an inverting configuration;
sampling an output of a second amplifier of the detection circuit to obtain a sampled output of the second amplifier for the first operational state of the detection circuit, the second amplifier coupled to the second terminal of the floating voltage source in an inverting configuration;
sampling an output of a third amplifier of the detection circuit to obtain a sampled output of the third amplifier for the first operational state of the detection circuit, the third amplifier coupled to a reference ground potential in an inverting configuration;
providing a second current to one of the first terminal and the second terminal of the floating voltage source to set a second operational state of the detection circuit;
resampling the outputs of the first, second and third amplifiers for the second operational state of the detection circuit; and
calculating a value of a leakage impedance of the floating voltage source based on the sampled and resampled outputs of the first, second and third amplifiers.

26. The method of claim 25, wherein sampling further comprises sampling the outputs of the first and second amplifiers sequentially.

27. The method of claim 25, wherein sampling further comprises sampling the outputs of the first and second amplifiers simultaneously.

28. The method of claim 25, wherein providing the first and second currents further comprises setting at least one of the first and second currents as a function of one or more outputs of the first, second and third amplifiers.

29. The method of claim 28, further comprising diagnosing operation of the detection circuit based on the outputs of the first, second and third amplifiers for at least one of the first and second operational states of the detection circuit.

30. The method of claim 29, wherein diagnosing further comprises comparing the outputs of the first, second and third amplifiers.

31. The method of claim 30, wherein comparing further comprises determining whether one or more of the outputs of the first, second and third amplifiers are settled.

32. The method of claim 31, further comprising resampling at least one of the outputs of the first, second and third amplifiers for at least one of the first and second operational states of the detection circuit if it is determined that at least one of the outputs of the first, second and third amplifiers is not settled.

33. method of claim 29, wherein calculating the value of the leakage impedance further comprises calculating a first component and a second component of the leakage impendence, the first and second components further based on gains of the first, second and third amplifiers.

* * * * *